US008970706B2

(12) United States Patent
Scott

(10) Patent No.: US 8,970,706 B2
(45) Date of Patent: Mar. 3, 2015

(54) DUAL PIXEL PITCH IMAGING ARRAY WITH EXTENDED DYNAMIC RANGE

(71) Applicant: Basil Henry Scott, Kapaa, HI (US)

(72) Inventor: Basil Henry Scott, Kapaa, HI (US)

(*) Notice: Subject to any disclaimer, the term of this patent is extended or adjusted under 35 U.S.C. 154(b) by 346 days.

(21) Appl. No.: 13/625,493

(22) Filed: Sep. 24, 2012

(65) Prior Publication Data
US 2013/0076910 A1 Mar. 28, 2013

Related U.S. Application Data

(60) Provisional application No. 61/538,064, filed on Sep. 22, 2011.

(51) Int. Cl.
H04N 5/33 (2006.01)
H04N 5/343 (2011.01)
H04N 5/369 (2011.01)

(52) U.S. Cl.
CPC ............... H04N 5/332 (2013.01); H04N 5/343 (2013.01); H04N 5/3696 (2013.01)
USPC .......................................................... 348/164

(58) Field of Classification Search
USPC ..................................... 348/61, 164; 257/440
See application file for complete search history.

(56) References Cited

U.S. PATENT DOCUMENTS

| 5,559,336 | A | * | 9/1996 | Kosai et al. | 250/370.13 |
|---|---|---|---|---|---|
| 6,034,407 | A | * | 3/2000 | Tennant et al. | 257/440 |
| 2003/0001093 | A1 | * | 1/2003 | Wood | 250/332 |
| 2009/0212197 | A1 | * | 8/2009 | Buttgen et al. | 250/208.1 |
| 2011/0063483 | A1 | * | 3/2011 | Rossi et al. | 348/294 |
| 2012/0062244 | A1 | * | 3/2012 | Santana et al. | 324/658 |
| 2012/0188415 | A1 | * | 7/2012 | Johnson | 348/241 |
| 2013/0043372 | A1 | * | 2/2013 | Wehner et al. | 250/208.1 |

* cited by examiner

Primary Examiner — Jay Patel
Assistant Examiner — Francis G Geroleo
(74) Attorney, Agent, or Firm — Keri Ann K. S. Krzykowsk; Martin E. Hsia

(57) ABSTRACT

An integrated focal plane provides two co-aligned, overlapping pixel arrays in two formats, one with large pixels and low pixel count, the other with small pixels and high pixel count. Typically, the large pixels are 10 to 100 times larger in area than the small pixels. The dual arrays are disposed in a single detector substrate flip-chip bonded to a single readout circuit. They are sensitive to two infrared colors, one shorter and one longer wavelength band. The dual array focal plane concurrently provides two distinct pixel instantaneous fields of view within the same overall field of view as well as simultaneous fast and slow frame rates. The dual frame rates allow for combined fast sensing with sensitive imaging. Differing spatial and temporal data enables enhanced image processing for improved clutter rejection and detection performance. Differing gains combined with the dual frame rates provide an extended dynamic range.

15 Claims, 12 Drawing Sheets

DUAL PIXEL PITCH IMAGING ARRAY WITH EXTENDED DYNAMIC RANGE

This application claims the priority of U.S. provisional patent application No. 61/538,064 filed Sep. 22, 2011.

FIELD OF THE INVENTION

The present invention generally relates to camera focal plane imaging arrays. More specifically, the invention relates to a camera focal plane imaging array that is optimized to meet competing performance requirements for military or security sensing systems.

BACKGROUND OF THE INVENTION

For military-use or security-use systems, multiple competing requirements complicate sensor design, especially infrared (IR) sensor design. Quantitatively, an ideal military/security system needs a fast sensing mode that operates at maximum rates of 1500 to 5000 frames per second, combined with a slow, staring capability that can match the sensitivity of a high-quality 30 frame per second sensor. It needs resolution suitable for fine-grained images, and a dynamic range (the difference between the darkest signal that can be measured and the brightest signal that can be measured) of over one million times (10 million or more is optimal). It should provide new types of raw data that enable qualitative improvements in anti-clutter techniques, that is, techniques to distinguish between threatening events and other manmade events of no interest (non-threatening events).

No detector technology exists that meets these goals. Systems are typically customized to support a specific requirement; for example, they are able to function in an optically bright tactical military environment or an optically dark environment, but not both. Or, as another example, they are optimized for speed by sacrificing resolution, or optimized for resolution by sacrificing speed.

Design approaches employed today focus primarily on enhanced resolution, i.e. more pixels and smaller pixels. This is important, but it only addresses one aspect of the multiple critical needs outlined above. A second area of design emphasizes "all digital" sensor chips wherein signal digitization is performed on the sensor readout circuit instead of off the sensor chip assembly. Some of these designs have the potential to address the need for larger dynamic range.

When higher data processing speeds are required, either a design tradeoff is made—fewer pixels for less resolution and therefore less data to be processed—or output channels are added to enable the higher speed. For example, rather than using two or four pixel data signal lines, eight or sixteen could be used. This achieves a 2× to 8× speed improvement, but adds complexity to the external chip control electronics and to the camera mechanical housing, which is typically a cryogenic dewar flask. An improvement of 25× to 50× is what is really required (for example, from 60 frames per second to 2000 frames per second or greater).

Current IR sensors achieve a dynamic range of less than 20 thousand, and this often presents a problem in real applications. In comparison, the human eye can see a total brightness range of over one million times. In visible photography, systems have been produced that achieve a dynamic range of over one million—these are called HDR for High Dynamic Range. Also, so-called sigma-delta digital designs, if implemented with 20 or more encoding bits, have the potential for a dynamic range of one million. However, both HDR and the sigma-delta approach result in performance tradeoffs. A different approach is used here.

Clutter rejection methods have employed two-color radiometric techniques, which are highly effective, but clutter in the IR bands remains a difficult problem. Two-color methods typically compare the brightness in two IR bands to determine the approximate temperature range of an object or event. The temperature information is then used to determine whether an observed event is threatening, such as the launch of a shoulder-fired missile, or benign, such as the glint of the sun off a car windshield. However, these techniques are limited by how precisely the temperature is determined. They are also limited because some benign events have similar temperatures to threatening ones. For example, it would be difficult to distinguish a gunshot from an automobile backfire using temperature alone. Achieving better results in this area requires the equivalent of combining multiple sensor data with the two-color radiometry data.

Achieving the very large dynamic range of operation required for military/security systems, combined with flexible operation, while providing new types of data for clutter rejection is a very difficult challenge. Simply extending current design approaches is not the answer. A new approach is needed.

In part, the inspiration for a sensor that can address the above needs can be drawn from biology and the human eye. The eye combines two types of sensors, rods and cones, each of which is optimized for different sensing regimes. The eye and neural pathways also allow for multiple modes of sensing, including fast reactions and "normal" scanning of a scene for more detail, which is significantly slower. Finally, the eye extends its dynamic range with the pupil, which provides fast dim/bright switching based on overall scene brightness.

Accordingly, it is an object of the present invention to provide a sensor that can sense very high-speed events, typically associated with weaponry. Examples include sensing projectiles such as bullets; tracking supersonic maneuvering missiles; sensing the launch flash from the ejection of a projectile from a weapon; and detecting gunshot muzzle flashes.

It is another object of the present invention to provide a sensor with the ability to support a high (large) dynamic range, i.e. the ability to simultaneously sense dim or low contrast objects along with bright or high contrast objects. Examples of dim/low contrast objects include cold objects in space, or concealed personnel against a warm earth background. Examples of bright or high contrast objects include gunfire or explosions.

It is a further object of the present invention to provide a sensor that can avoid saturation for very bright events, such as large explosions. If a sensor is saturated, it is temporarily blinded.

It is still a further object of the present invention to provide a sensor with the ability to produce a high-resolution image that shows detail.

It is still a further object of the present invention to provide data that can be used to improve methods to avoid false alarms from manmade signals or clutter, which typically limit sensor performance more than signal to noise for non-space applications.

The following patents may be relevant to the field of the invention:

U.S. Pat. No. 7,608,823 to Tennant, incorporated herein by reference, discloses a multimode focal plane array architecture with electrically isolated commons for independent subarray biasing to accommodate large bias amplitude differences and different temporal bias profiles.

U.S. Pat. No. 7,075,079 to Wood, incorporated herein by reference, discloses a dual wavelength focal plane having a first array of infrared sensing pixel elements, and a second array of visible light pixel elements adapted to be selective to colors encountered while driving an automobile. The arrays are vertically stacked on a monolithic silicon substrate, and they are electrically coupled to a processor and display to integrate the infrared and color pixel elements into a view for a driver of the automobile.

U.S. Pat. No. 6,407,439 to Hier et al., incorporated by reference, discloses a plurality of photodetectors, each sensitive to different wavelengths, integrated on a common semiconductor substrate. The different photodetectors can be stacked over one another or placed laterally on the common substrate. Three of such photodetectors can form a pixel of an active matrix array for an image sensor. The different photodetectors in each pixel can be multiplexed electronically. The electronic circuits for activating the different photodetectors can be integrated on the same substrate.

U.S. Pat. No. 6,034,407 to Tennant, incorporated herein by reference, discloses multi-spectral planar photodiode pixels for simultaneously detecting multi-colors of infrared radiation. Each multi-spectral planar photodiode pixel includes a semiconductor substrate layer, a buffer layer of a first conductivity type material deposited on a semiconductor substrate layer, and a first color layer of the first conductivity type material deposited on the buffer layer. The multi-spectral planar photodiode pixel further includes a barrier layer of the first conductivity type material deposited on the first color layer, a second color layer of the first conductivity type material deposited on the barrier layer, and a cap layer of the first conductivity type material deposited on a the second color layer. A first diode comprising of a second conductivity type material is formed in the first color layer, and a second diode comprising a second conductivity type material is formed in the second layer.

U.S. Pat. No. 5,903,659 to Kilgore, incorporated herein by reference, discloses an adaptive method for removing fixed pattern noise from focal plane array (FPA) imagery (sensor images). A set of correction tenus is applied to a blurred version of the FPA image, and a filter is applied to the corrected, blurred image. Fixed pattern noise errors are then calculated using the filtered imagery, and employed to update the correction terms. The updated correction terms are then used for processing the next image. In one embodiment, the filter is an anti-median filter. In another embodiment, the filter is an anti-mean filter. These methods are commonly referred to as non-uniformity correction, or NUC.

U.S. Pat. No. 5,751,049 to Goodwin, incorporated herein by reference, discloses a two-colored infrared detector comprising elements having one or more diodes and a metal insulator semiconductor (MIS) device. The diodes are comprised of regions of semiconductor materials, which are operable to generate electron-hole pairs when struck by infrared radiation having first and second wavelengths. The capacitor includes a gate which is operable to generate a potential well in the first semiconductor region in conjunction with an insulator layer and collect charges generated by the first wavelength of infrared radiation. The layers of semiconductor material may be varied to enhance the performance of the resulting infrared device.

U.S. Pat. No. 5,583,338, to Goodwin, incorporated herein by reference, discloses a HgCdTe S-I-S (semiconductor-insulator-semiconductor) two color infrared detector wherein the semiconductor regions are group II-VI, with different compositions for the desired spectral regions. The device is operated as a simple integrating MIS device with respect to one semiconductor.

U.S. Pat. No. 5,559,336 to Kosai et al., incorporated herein by reference, discloses a radiation detector pixel unit cell with a n-p +LWIR photodiode that is vertically integrated with a p+n MWIR detector in a n-p+-n structure. Electrical contact is made separately to each of these layers in order to simultaneously detect both the LWIR and MWIR bands. The electrical contact is made via indium bump interconnections so that the detector unit cell can be subsequently hybridized with a topside mounted electronic readout integrated circuit. The n-p+-n structure in a given pixel of an array of radiation detector pixels is electrically isolated from all neighboring pixels by a trench that is etched into an underlying substrate.

U.S. Pat. No. 5,120,960 to Halvis, incorporated herein by reference, discloses an infrared (IR) imaging device with substantially identical top and bottom IR detector arrays. In separate embodiments, either a top or bottom surface of the top array is stacked onto the bottom array to confront a top surface of the bottom array. Individual detector elements and subarrays of the top array are aligned with corresponding detector elements and subarrays of the bottom array. The image readout circuits of both the top and bottom array are connected by wire bonding to readout control circuits formed in the peripheral region of the wafer in which the bottom array is formed. These IR detector arrays are formed on separate substrates. Furthermore, the two sub-arrays are aligned in a one-to-one pixel relationship, the purpose being to eliminate non-operational pixels from the combined dual array.

DISCLOSURE OF THE INVENTION

The above and other objects are preferably achieved by a focal plane imaging array having a dynamic range, comprising: a detector with a large pixel array having a plurality of large pixels, each of the large pixels having a large pixel area and a large pixel signal contact, to create a first signal that travels to the large pixel signal contact, and a small pixel array having a plurality of small pixels, each of the small pixels having a small pixel area and a small pixel signal contact, to create a second signal that travels to the small pixel signal contacts, wherein the plurality of small pixels is greater than the plurality of large pixels, wherein the large pixel array and the small pixel array are aligned and vertically stacked on a monolithic semiconductor substrate; a readout integrated circuit operably interconnected to the large pixel signal contacts and the small pixel signal contacts; and a clock operably connected to the large pixel signal contacts and the small pixel signal contacts to read the first signals at a first clock rate having a first integration time and a first reset time, and to read the second signals at a second clock rate having a second integration time and a second reset time. The first clock rate is preferably faster than the second clock rate, and the reading of the first signals at the first clock rate, and the second signals at the second clock rate, extends the dynamic range of the focal plane imaging array.

The presently preferred embodiment of the focal plane imaging array also contains a large pixel area that is at least twice as large as the small pixel area. The first clock rate is also preferably at least 1500 frames per second, whereas the second clock rate is preferably no more than 500 frames per second.

The focal plane imaging array also preferably contains a wide band gap barrier between the large pixel array and the small pixel array to prevent crosstalk between the large pixels and the small pixels. The large pixels are responsive to a first brightness range, and the small pixels are responsive to a second brightness range, wherein the first brightness range is different from the second brightness range. The large pixels also absorb a first wavelength and said small pixels absorb a second wavelength.

The readout integrated circuit of the presently preferred embodiment of the focal plane imaging array described above further preferably comprises: a large pixel amplifier having an electrical gain for receiving the first signal and creating a large pixel output voltage; a large pixel comparator to receive the large pixel output voltage; a plurality of small pixel amplifiers for receiving the second signal and creating small pixel output voltages; and a small pixel comparator to receive the small pixel output voltages.

When the large pixel output voltage indicates that the large pixel is saturated, the large pixel comparator outputs a TRUE value that changes the first clock rate to have a first changed integration time and a first changed reset time, wherein the first changed integration time is shorter than the first integration time and the first changed reset time is greater than the first reset time. If the large pixel output voltage indicates that the large pixel is unsaturated, the large pixel comparator outputs a FALSE value and the first clock rate maintains the first integration time and the first reset time.

When the small pixel output voltages indicate that a preset number of small pixels are saturated, the small pixel comparator outputs a TRUE value that changes the second clock rate to have a second changed integration time and a second changed reset time, wherein the second changed integration time is less than the second integration time and the second changed reset time is greater than the second reset time. If the small pixel output voltages indicate that the small pixels are unsaturated, the small pixel comparator outputs a FALSE value and the second clock rate maintains the second integration time and the second reset time.

Further, if the small pixel output voltages indicate that a preset number of the small pixels are saturated while using the second changed integration time and a second changed reset time, the small pixel comparator will output another TRUE value that changes the second clock rate so that it has a second re-changed integration time and a second re-changed reset time, wherein the second re-changed integration time is shorter than the second changed integration time and the second re-changed reset time is longer than the second changed reset time. If the small pixel output voltages indicate that the small pixels are unsaturated while using the second changed integration time and a second changed reset time, the small pixel comparator will output a FALSE value and the second clock rate will remain at the second changed integration time and the second changed reset time.

Ultimately, the reading of the first signals at the first changed integration time, and the second signals at the second changed integration time and the second re-changed integration time, extends the dynamic range of the focal plane array.

The readout integrated circuit of the focal plane imaging array also preferably contains a master frame reset clock to send a small pixel reset signal, which causes the second changed integration time and second changed reset time to return to the second integration time and the second reset time, and causes the second re-changed integration time and the second re-changed reset time to return to the second integration time and the second reset time.

The second reset time, the second change reset time, and/or the second re-changed reset time described above also preferably causes a large pixel reset signal which changes the first changed integration time and the first changed reset time to the first integration time and first reset time.

The large pixel amplifier of the readout integrated circuit further comprises: a first integration capacitor for storing the first signal and producing the large pixel output voltage; and a second integration capacitor for storing the first signal. If the large pixel output voltage saturates, the second integration capacitor is turned on to reduce the electrical gain, and if the large pixel output voltage is unsaturated, the second integration capacitor is turned off.

The invention also preferably comprises a capacitor averaging comparator for comparing a plurality of pixel electrical signals, each having a signal voltage, comprising: a plurality of signal switches, each signal switch corresponding to one of the pixel electrical signals; a buffer amplifier connected to the signal switches; a first capacitor; a first capacitor switch connected between the buffer amplifier and the first capacitor; a second capacitor; a second capacitor switch connected between the first capacitor and the second capacitor; and a latching comparator connected to the second capacitor controlled by a comparator control voltage.

When the signal switches are sequentially closed, each of the pixel electrical signals is sequentially sent to the buffer amplifier. When the first capacitor switch is closed, the buffer amplifier drives the first capacitor to store a first stored voltage that is proportional to the signal voltage. When the first capacitor switch opens, the second capacitor switch closes and charge is transferred between the first and second capacitors, causing any prior stored voltage on the second capacitor and the first stored voltage on the first capacitor to form a weighted average voltage. The comparator compares the weighted average voltage to the comparator control voltage. The weighted average is based on the ratio of capacitance between the first capacitor and the second capacitor, and if any of the weighted average voltages exceeds the comparator control voltage, then the comparator latches to a high value.

The small pixel comparator of the readout integrated circuit (described above) may also preferably be a capacitor averaging comparator for comparing a plurality of pixel electrical signals, each having a signal voltage, further comprising: a plurality of signal switches, each signal switch corresponding to one of the pixel electrical signals; a buffer amplifier connected to the signal switches; a first capacitor; a first capacitor switch connected between the buffer amplifier and the first capacitor; a second capacitor; a second capacitor switch connected between the first capacitor and the second capacitor; and a latching comparator connected to the second capacitor controlled by a comparator control voltage.

When the signal switches are sequentially closed, each of the pixel electrical signals is sequentially sent to the buffer amplifier. When the first capacitor switch is closed, the buffer amplifier drives the first capacitor to store a first stored voltage that is proportional to the signal voltage. When the first capacitor switch opens, the second capacitor switch closes and charge is transferred between the first and second capacitors, causing any prior stored voltage on the second capacitor and the first stored voltage on the first capacitor to form a weighted average voltage. The comparator compares the weighted average voltage to the comparator control voltage. The weighted average is based on the ratio of capacitance between the first capacitor and the second capacitor, and if any of the weighted average voltages exceeds the comparator control voltage, then the comparator latches to a high value.

The above and other objects are also preferably achieved by a process for using a focal plane imaging array having a background brightness and a detector operably connected to a readout circuit having a large pixel array with a plurality of large pixels, each of the large pixels having a large pixel area and a large pixel signal contact, to absorb a first wavelength, and a small pixel array having a plurality of small pixels, each of the small pixels having a small pixel area and a small pixel signal contact, to absorb a second wavelength, wherein said plurality of small pixels is greater than said plurality of large pixels, and wherein the large pixel array and the small pixel array are aligned and vertically stacked on a monolithic semiconductor substrate, comprising: illuminating the large pixel array and small pixel array with an infrared light source to create a first signal that travels to the large pixel signal contacts, and a second signal that travels to the small pixel signal contacts; clocking the first signal at a first clock rate having a first integration time and a first reset time, and the second signal at a second clock rate having a second integration time and a second reset time, wherein the first clock rate is faster than the second clock rate; and shortening the first integration time if the first signal saturates the large pixels between the first rest times, and reducing the second integration time if the second signal saturates the small pixels between the second reset times. This process achieves an extended dynamic range and better clutter rejection for the focal plane array.

The process also preferably includes determining an average for the background brightness; processing the first signal to detect fast events having a fast event brightness that occurs within a time range, and the second signal to detect standard events having a standard event brightness, wherein the fast event brightness is comprised of the background brightness and an actual fast event brightness, and the standard event brightness is comprised of the background brightness and an actual standard event brightness; calculating the actual fast event brightness and the actual standard event brightness; comparing the actual fast event brightness and the actual standard event brightness to approximate a temperature range for the fast events and the standard events; and determining whether the fast events and the standard events are threatening based on the temperature range.

The step of calculating the actual fast event brightness and the actual standard event brightness preferably comprises: determining a spatial correction factor for the fast event brightness based on the spatial extent of the standard event brightness, and a temporal correction factor for the standard event brightness based on the duration of the fast event brightness; correcting the background brightness using the spatial correction factor to achieve a spatially corrected background brightness, and using the temporal correction factor to achieve a temporally corrected background brightness; and subtracting the spatially corrected background brightness from the fast event brightness to achieve the actual fast event brightness, and subtracting the temporally corrected background brightness from the standard event brightness to achieve the actual fast event brightness.

DESCRIPTION OF THE PRESENTLY PREFERRED EMBODIMENT

The presently preferred embodiment of the invention is a monolithic, two-color, dual pixel pitch focal plane array with variable complementary timing and an extended (increased) dynamic range.

Infrared (IR) focal plane arrays consist of two parts: a detector and a readout integrated circuit (ROIC). These two parts are interconnected using well-known techniques such as hybridization with indium bump connections. The detector and readout combination is referred to generically as a sensor chip assembly (SCA). The presently preferred embodiment of the invention uses these well-known methods.

The detector of the present invention is preferably monolithic, that is, formed in a single piece. It preferably contains two arrays, preferably operating in two colors (so the sensing elements for one color do not block the sensing elements for the other, as described below), preferably aligned and vertically stacked on a monolithic (single) semiconductor substrate (structure). It is made using well-known techniques for growing and processing multi-layered detectors. P-on-n diodes are described in the detailed descriptions below, but n-on-p may also be used, if applicable. The two colors can be any two IR bands within the sensitivity range of the materials that might be used. The presently preferred invention can be implemented in all commonly used quantum detectors, for example made of HgCdTe, InAs—GaSb strained layer superlattice, etc.

Figure 1:
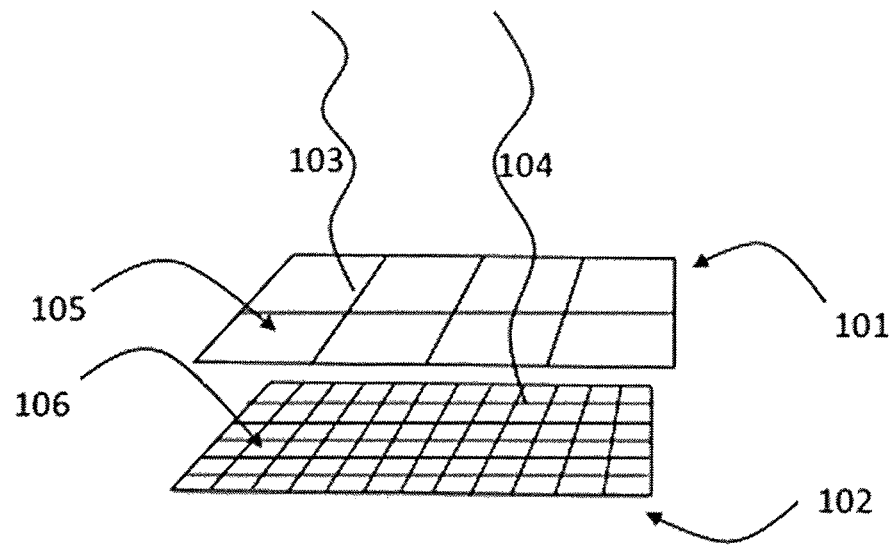
FIG. 1—Dual Pixel Pitch Array, Concept
FIG. 2—Dual Pixel Pitch Array, Top Plan View
FIG. 3—Etched Planar Structure, Top Plan View
FIG. 4—Etched Planar Structure, Side Elevational View
FIG. 5—Large Pixel with Windows for Small Pixels
FIG. 6—Etched Planar Structure, Side Elevational View, Alternative A
FIG. 7—Etched Planar Structure, Side Elevational View, Alternative B
FIG. 8—Mesa Structure, Side Elevational View
FIG. 9—Mesa Structure, Top Plan View
FIG. 10—Back-to-Back Two-Color Photodiode Arrangement, Side Elevational View
FIG. 11—Back-to-Back Photodiodes as a Dual Pixel Pitch Array, Side Elevational View
FIG. 12—Pixel Time Signals
FIG. 13—Large Pixel Timing Logic States and Transition Events
FIG. 14—Small Pixel Timing Logic States and Transition Events
FIG. 15—Circuit Elements for Extended Dynamic Range Operation
FIG. 16—Averaging Comparator Circuit
FIG. 17—Preferred Large Pixel Amplifier Circuit Block
FIG. 18—Normalizing for Spatial Extent to Support Two-Color Ratio Calculations
FIG. 19—Normalizing for Temporal Extent to Support Two-Color Ratio Calculations

The present invention preferably uses arrays that are structured so that they function as one being on top of the other, as depicted in FIG. 1 with arrays 101 and 102. Because one array sits on top of the other, the light 104 for the second array 102 passes through the first array 101. This automatically results in two-band operation, since the first array 101 absorbs one set of colors, shown as light 103, while allowing other colors 104 to pass through to the second array 102.

The first major difference between the presently preferred embodiment of the invention and prior art two-color IR arrays is that one of the two arrays in the present invention is preferably comprised of much larger pixels than the other. The larger pixels are preferably made at a specific integer multiple of the smaller, standard sized, pixels. While any ratio of 2 times larger or greater could be used, the preferred design is for substantially oversized pixels that are approximately 10×, 25×, or even 100× larger in area. This is depicted in FIG. 1, in which large pixels 105 in array 101 have an area that is 9× larger than the small pixels 106 in array 102.

At first glance, making one array with such substantially oversized pixels seems to be odd and undesirable. Very significant research and development resources have been expended to develop high pixel count arrays with very small pixels, which increases resolution significantly. The large pixels according to the present invention sacrifice resolution in one color. Furthermore, because they are so large, they potentially cause electrical design problems (e.g. larger transistors may be necessary, different bias settings could be required, and different gain designs could be needed). In fact, for some popular two-color designs in use today, this arrangement will not work.

However, the large/small pixel combination has many advantages that allow the presently preferred embodiment of the invention to better address the challenges for military/security sensors than traditional sensors. Many of these advantages may not be immediately obvious and others are realized through a combination of features. To fully realize these advantages requires a combination of (1) different clocking of the two separate arrays; (2) methods for extending (increasing) the dynamic range of the sensor utilizing variable clocking; and (3) new methods for two-color radiometry. However, any of these methods implemented singly, rather than in combination, still offers certain advantages.

In the presently preferred embodiment of the invention, the two separate arrays within the invention are clocked at two different rates, one fast and one slow. This fast/slow clocking addresses the military/security need for sensing of very fast events while simultaneously performing slower, staring sensing. It also mimics human visual perception, which includes fast, involuntary sensing along with "normal" scanning of a scene to see detail. In the presently preferred embodiment of the invention, the fast array is preferably clocked from 1500 to 5000 frames per second; alternate embodiments can include clocking at a faster or slower rate than this preferred range. The small pixel array is clocked at a much slower speed. This preferably ranges from 30 frames per second to as fast as 500 frames per second, depending on the needs of the application.

The large pixels are clocked fast even though this presents obvious electrical design challenges. The large pixels have larger capacitance (i.e. larger ability to store an electrical charge), and therefore, their electronic amplifiers require much larger current drive capability than would be required for the smaller pixels if they were clocked fast. However, clocking the small pixels at rates of 1500 to 5000 frames per second results in an output data rate that is far too high. For example, an array in the popular video graphics array (VGA) IR format of 512×640 pixels would produce an output data rate that is over 5× faster than available output and processing technologies can support. But because there are fewer of the larger pixels—$\frac{1}{10}^{th}$, $\frac{1}{25}^{th}$, or even $\frac{1}{100}^{th}$ of the number of small pixels—they can be clocked at these high rates without producing excessive data output rates.

The present invention achieves very high dynamic range operation by combining two methods. The first utilizes offset optical responsivities for the large and small pixels such that they respond to two different light brightness ranges. For example, large pixels can be designed and operated to respond to optical flux levels ranging from $10^9$ to $10^{13}$ photons/sec/cm2, whereas small pixels can be designed and operated to respond to optical fluxes ranging from $10^6$ to $10^{10}$ photon/sec/cm2. In this case, the large, fast-clocked pixels will not saturate with very bright signals, whereas the small pixels will. Conversely, the higher sensitivity of the small pixels enables very dim objects to be detected, whereas these objects will be below the noise threshold for the lower sensitivity large pixels. In this example, the combined operation of the two pixel arrays provides a dynamic range of 10 million, from $10^6$ to $10^{13}$ photons per second.

Additional dynamic range improvement may be realized through variable integration timing, in which standard integration time (the time during which the pixel amplifier circuit integrates generated photocurrent from the detector) is dynamically switched to a shorter time. This allows for extended dynamic range operation in both colors individually rather than realizing it through the combination of the two colors as above. This allows for more robust sensing and the use of two-color radiometry for the entire extended range of operation. These and other techniques provide a dynamic range in excess of 150 dB for the present invention to achieve non-saturated operation for radiometric characterization of extremely bright events.

A non-obvious advantage of the present invention's architecture is improved clutter rejection. The presently preferred embodiment combines two-color radiometric techniques with multi-scale spatial and temporal data to provide the equivalent of three independent data streams for clutter rejection: two-color radiometry, dual timescale data, and dual spatial scale data. The multiple data streams allow corresponding multiple event filters to be applied to the problem of clutter and false alarm rejection. This will improve decision accuracy through the use of multiple Bayesian probabilistic tests or similar methods. For example, a bright momentary spot seen on the slow clocking small pixels that does not change on the fast clocking large pixels could be rejected as not being a fast event, such as gunfire or rocket propelled grenade launch.

A final non-obvious advantage of the present invention is improved detection performance in airborne environments. In these environments, air turbulence causes optical lensing effects that spread energy over a wider area on any focal plane array. In a typical sensor, this reduces detection performance because multiple photodiodes will contribute noise, thus lowering signal-to-noise. The large/small pixel combination in the present invention allows for a dual detection approach: standard methods with the small pixels, and detection with a larger spatial extent with the large pixels. Because the large pixels provide an independent signal that is less susceptible to turbulent air optical lensing effects, the detection according to the present invention is more robust.

Alternate implementations also offer advantages. Combining dual format pixels with dual clocks, one fast clock for large pixels and one slow clock for small pixels, adds considerable advantages. This implementation, although simplified from the presently preferred version, realizes the full advantages of spatial-temporal clutter rejection. A fast clock rate of 1500 frames per second or greater enables sensing the full range of threats consistent with military and security needs. In this alternate implementation, dynamic range improvements of 20 to 60 dB are practical through a combination of design and operational settings to enable offset responsivities for the large and small arrays.

Adding dynamically switched integration times for the two colors extends the dynamic range for both colors, enabling two-color radiometry and more robust sensing for the entire sensing range.

Two-color radiometry, enhanced detection, and improved clutter rejection for any of these combinations can be realized flexibly through off-chip processing.

The presently preferred embodiment of the invention can be further described in FIGS. 1-19. The detector of the present invention combines, in one monolithic structure, two aligned and vertically stacked pixel arrays, one with large pixels, and the other with smaller pixels. Each pixel in the large pixel pitch array will be aligned with a sub-array of the small pixel pitch array. Small pixel sub-arrays (i.e. the number of small pixels inside the boundary of a large pixel) may be of any size, from a two by two array to larger arrays of N×M pixels, where N and M are greater than two. The smaller pixels will be square in shape, but the larger pixels could be square or rectangular. There will be M times N fewer large pixels than small pixels. These two arrays will be controlled with two separate clock signals, and these signals will be dynamically switchable to enable extended dynamic range operation.

Infrared (IR) light is electromagnetic radiation with longer wavelengths than those of visible light. It extends from the nominal red edge of the visible spectrum at 0.74 µm to 300 µm. The wavelengths absorbed by the present invention can be adjusted. For example, wavelength 103 (shown in FIG. 1) could be Short Wave IR (SW) (between 1.5 µm-2.5 µm) and wavelength 104 (shown in FIG. 1) could be Mid-Wave IR (MW) (between 2.5 µm-5.0 µm). This would comprise a SW/MW detector. Similarly, 103 could be MW and 104 could be Long Wave IR (LW) (between 7 µm-12 µm), which would comprise a MW/LW detector. It is also possible for 103 to be a shorter MW wavelength, such as the 3.4 µm to 4.2 µm band, and for 104 to be a longer MW wavelength, such as the 4.4 µm to 5 µm band. This would comprise a MW/MW detector.

Figure 8:
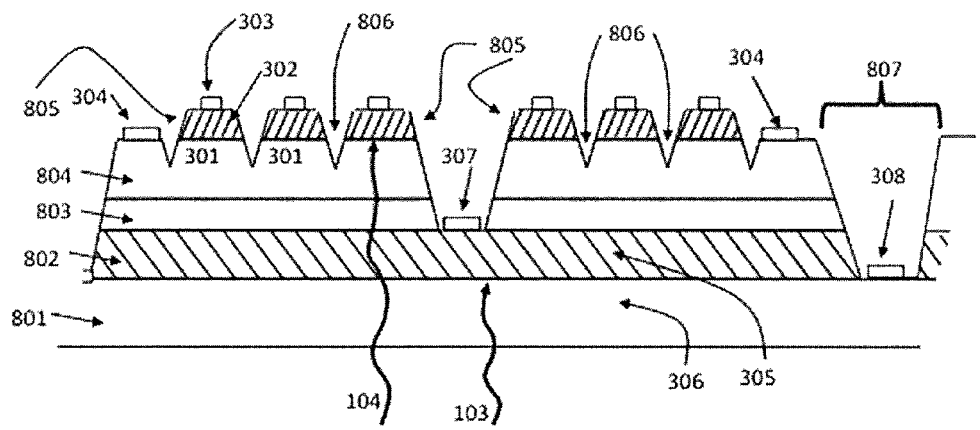
Figure 9:
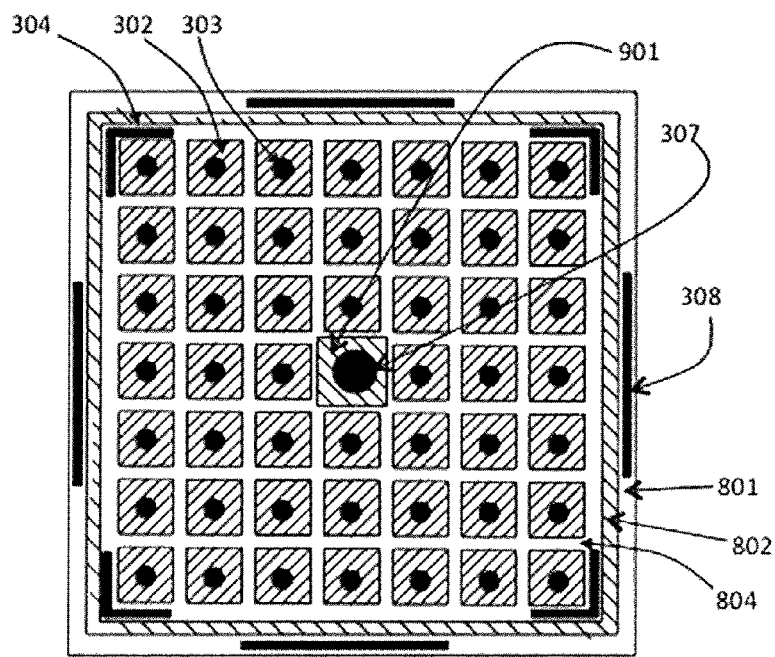
Figure 10:
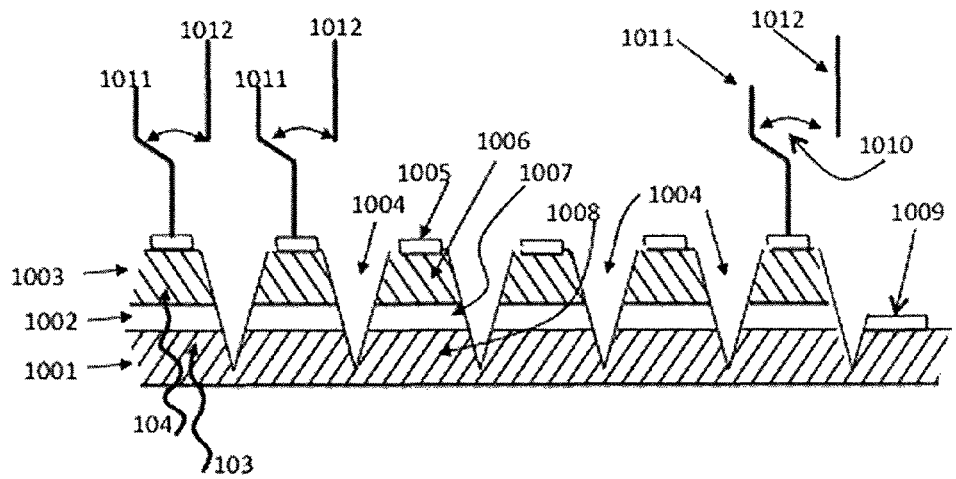
Figure 11:
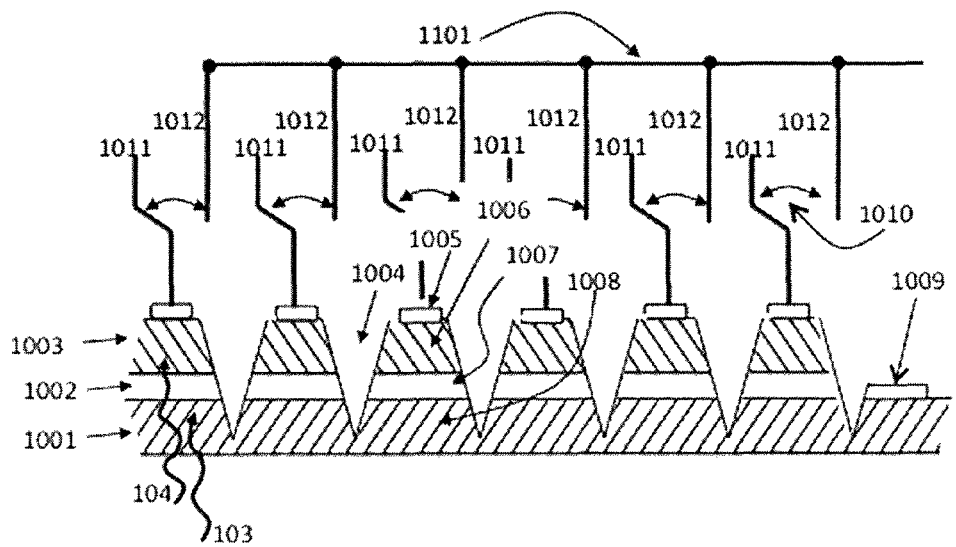

FIGS. 3 through 11 depict physical structures that can be used to implement the detector of the present invention. FIGS. 3 through 9 show preferred implementations and FIGS. 10 and 11 show alternate implementations. Any of these specific methods may be used to implement the large/small pixel structure. In addition, methods derived from these basic approaches may also be used.

Figure 2:
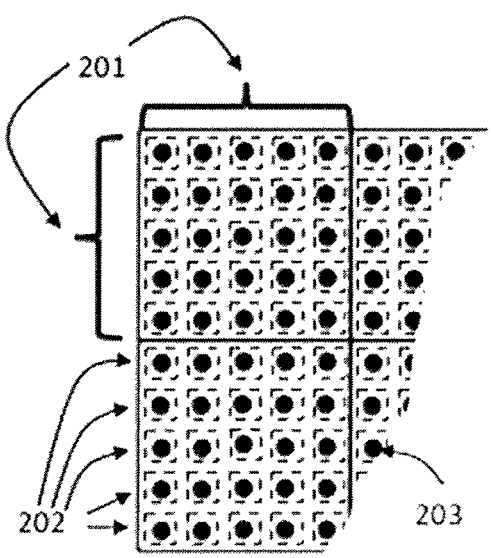

FIG. 2 shows a corner of a large array with large pixel 201 and small pixels 202. In FIG. 2, there are 5×5 small pixels for each large pixel. Small pixels are shown with signal contact 203. There are no other contacts or grounding structures shown in FIG. 2 for clarity. These details, which differ for different detector structures, are depicted in FIGS. 3 through 9.

Figure 3:
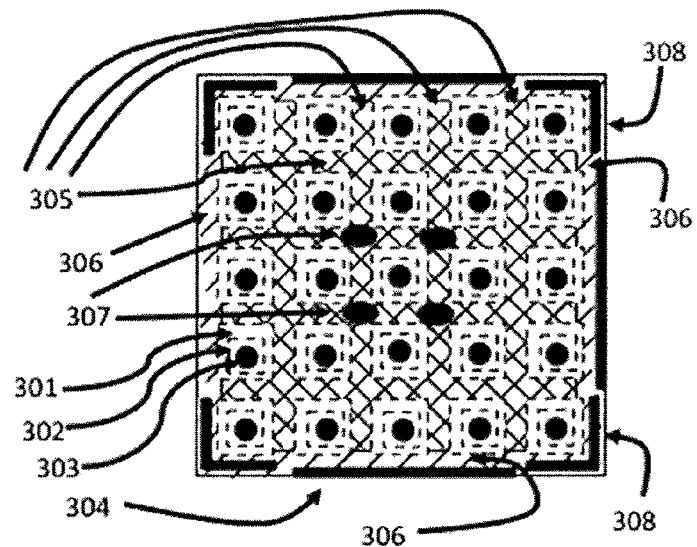
Figure 4:
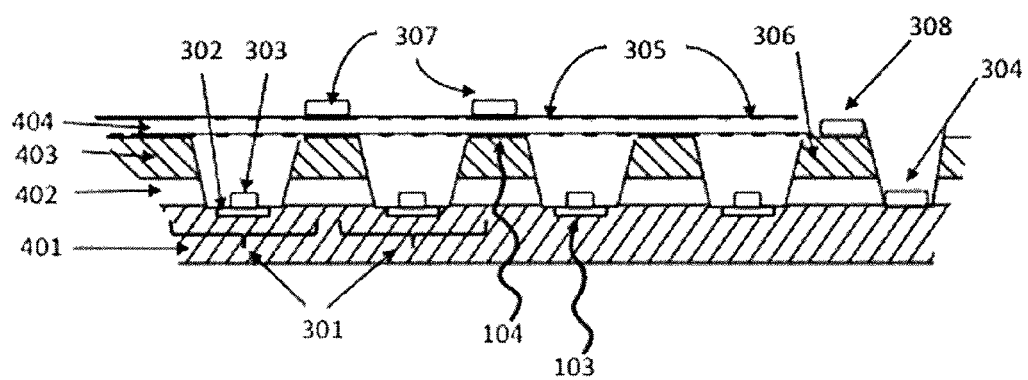

FIGS. 3 and 4 depict the planar, etched structure, showing a top plan view in FIG. 3 and a side elevational view in FIG. 4. These structures are fabricated using well-known techniques (Jagmohan Bajaj et. al., "Comparison of Type-II Superlattice and HgCdTe Infrared Detector Technologies," Infrared Technology and Applications XXXIV, edited by Bjørn F. Andresen, Gabor F. Fulop, Paul R. Norton, Proc. of SPIE Vol. 6542, 65420B (2007), incorporated herein by reference). Etched planar structures are a class of detector geometries characterized by growing layers on a substrate, and then performing etch and implantation steps to form diode structures. This differs from mesa structures in which diode structures are formed with etch steps only.

FIG. 4 shows layers 401, which is a band 1 n-type (or p-type) material, 402, which is a wide bandgap isolation layer, 403, which is a band 2 n-type (or p-type) material, and 404, which is a p-type (or n-type) material. These layers are grown on a substrate using well-known methods. The substrate is not shown in FIG. 4 for clarity. The grown layers are then etched and processed with implanted material to form the large and small pixels of the present invention. FIG. 4 shows how light of two different wavelengths, 103 and 104, are absorbed near the p-n junctions of the large and small pixels.

Small pixel 202 (shown in FIG. 2) consists of elements 301, 302 and 303 (shown in FIGS. 3 and 4). 301 is an n-type (or p-type) material that is part of layer 401, which is exposed through an etch step to make each of the small pixels. 302 is an implanted p-type (or n-type) material. Together, 301 and 302 form the p-n junction for the small pixel photodiode. 303 is a contact material that is deposited on top of 302. 303 is the signal contact for the small pixel. It is connected to the readout circuit using well-known methods. In the etched planar structure, the 5×5 array of small pixels are grounded with ground connect 304 (also shown in FIG. 4). The ground connect can be implemented in various shapes and sizes. The ground connect in FIG. 4 is shown as a connection along the edge of large pixel 201.

Large pixel 201 (shown in FIG. 2) consists of elements 305, 306, 307 and 308, all of which are shown in FIGS. 3 and 4. Element 306, the n-type (or p-) material, is almost completely covered by 305, the p-type (or n-) material. Together, 305 and 306 form the p-n junction of the large pixel photodiode. From the top plan view in FIG. 3, 306 is seen along the edge of large pixel 201, near ground contact 304 and indicated by the single-hatched area. In FIG. 3, element 305 is indicated by the crosshatched area.

Figure 5:
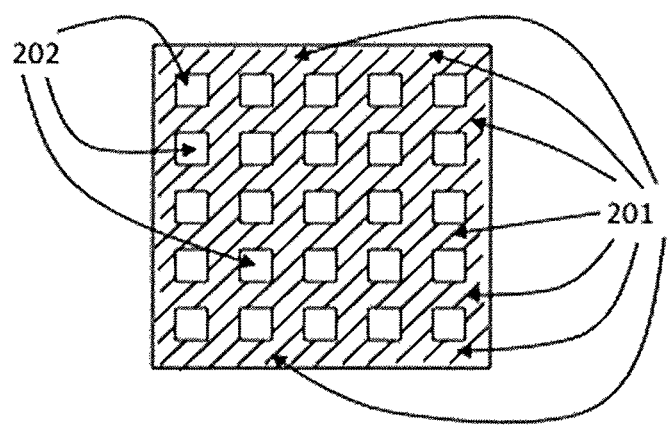

Note that for the detector shown in FIGS. 3 and 4, the small pixels 202 form holes or windows within the boundary of the large pixel 201. FIG. 5 shows the large pixel 201 as the hatched square area with small pixels 202. The surface of the etched planar large pixel as shown in FIGS. 3 and 4 is like a waffle, with holes for small pixels and a single large pixel defined by a raised contiguous area. Although overlaying the small pixel area 301 as indicated in FIG. 4, the large pixel does not block the small pixel because the large and small pixels are preferably sensitive to different colors.

FIGS. 3 and 4 also show signal contacts 307 and ground contacts 308 for the large pixel. These contacts can be of any size or shape. Because the large pixel has openings in it, several signal contacts 307 are used rather than a single large contact. Both 307 and 308 are depicted as material that is deposited onto the detector structure. These elements can also be formed by growing and etching additional layers.

The 5×5 array depicted in FIGS. 3, 4 and 5 is only one possible implementation of the present invention. Small pixel sub-arrays may be of any size from 2×2 or larger. Preferably, small pixels are separated from large pixels by a wide bandgap barrier layer 402 (shown in FIG. 4)—this is a preferred implementation, but may not be used in other alternate implementations. The barrier isolates the two overlapped pixel structures to avoid crosstalk between pixels.

The separate ground contacts ensure high-quality grounds to the readout with minimized crosstalk for both large and small pixel arrays. The arrangement of ground contacts 304 and 308 (shown in FIG. 4) is one of many possible arrangements. These ground contacts may be separately connected to ground paths in the readout circuit, or they may be connected as a single ground.

FIGS. 3 and 4 depict a planar etched structure that implements the present invention where the band 1 pixel is the small pixel and the band 2 pixel is the large pixel. Band 1 absorbs shorter wavelength light, and band 2 absorbs longer wavelength light.

Figure 6:
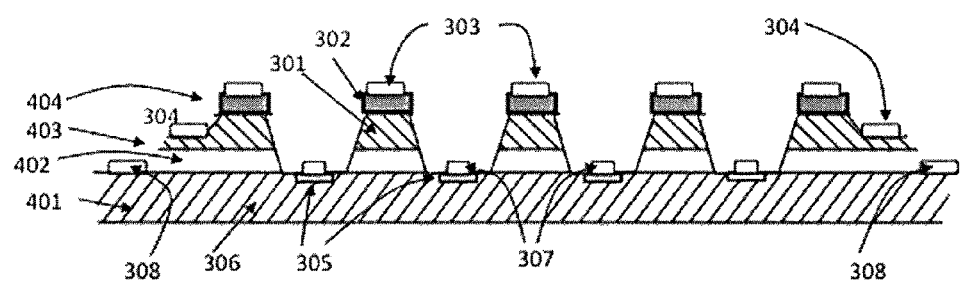
Figure 7:
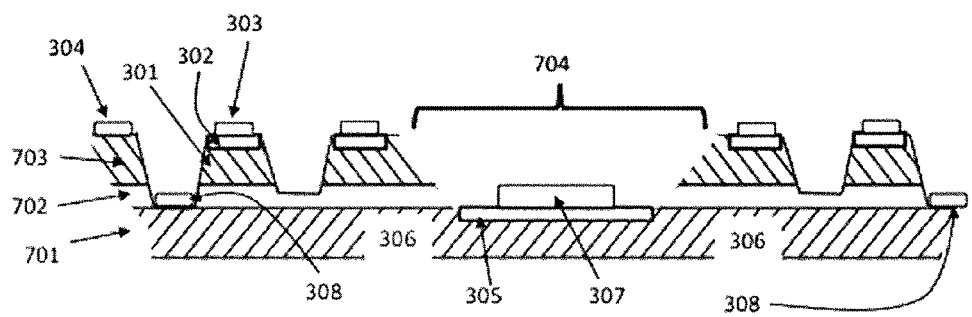

This arrangement can be reversed as shown in FIGS. 6 and 7. In FIG. 6, the same four-layer structure is used. Small pixels are formed by first etching trenches to delineate them. Elements 301, 302 and 303 form the small pixels. Ground contact 304 is positioned differently than in FIG. 4, and a different etch depth is required. The large pixel is formed by elements 305, 306, 307, and 308. Large pixels are delineated by an etch into layer 401; this etch is not shown in the figure for clarity. It divides layer 401 into multiple elements 306, rather than the single element 306 that is shown. Within the single large pixel boundary, multiple elements 305 are used to make the p-n junction for the large pixel photodiode. These dispersed junctions avoid the need to eliminate one or more small pixels, which is the case for the example of FIG. 7.

Here, in FIG. 6, all of the contacts 307 connect to a single unit cell amplifier for the large pixels. These contacts are similar to the small pixel contacts of FIG. 4, but they are spaced differently and there are fewer of them.

FIG. 7 depicts another method for implementing a detector according to the present invention such that the small pixels absorb the longer wavelength radiation and the large pixel absorbs the shorter, which is the opposite of the methods depicted in FIG. 4. In FIG. 7, the detector material is formed by growing only three layers on the substrate. Layer 701 is n-type (or p-) material, layer 702 is a wide bandgap isolation layer, and layer 703 is made of n-type (or p-) material, just like layer 701. Small pixels are formed by first etching trenches through 703 and into 702 to form 301. 302 is formed by implanting p-type (or n-) material into 703 (301). This forms the p-n junction for the small pixel photodiode. 303 is contact material that is deposited onto 302; it provides a signal contact to the readout circuit. A four-layer version of this band 1/band 2 structure can be made with a p-type (or n-) material grown on top of 703 and etching trenches. The grown layer then forms 302 rather than implanted material. A five-layer version is also possible, in which a contact material layer is grown and elements 304 and 303 are formed by etching this layer. In any of these cases, elements 304 provide a ground contact for the group of small pixels 202 that are within the boundary of the single large pixel 201.

In FIG. 7, large pixels are formed by etching a large window 704 into and through layers 703 and 702, then implanting p-type (or n-) material into 701 (306) to form 305. Together 305 and 306 form the p-n junction. Contact material 307 is deposited onto 305. Elements 308 provide ground contact. 307 provides a signal contact to the readout circuit. The large window requires that one or more small pixels are eliminated, but in this structure, as few as only three layers are required. This is potentially an advantage since growing a smaller number of layers is faster and less expensive.

As FIGS. 4, 6 and 7 show, the etched planar structure allows for the large pixel to be implemented in either band 1 or band 2 material. For the arrangements shown in FIGS. 6 and 7, the large pixel is continuous, with no windows as depicted in FIG. 5; however, the small pixel fill factor may be reduced compared to the FIG. 4 arrangement. In FIG. 4, the effective quantum efficiency of the large pixel is reduced because it is not a solid square.

FIGS. 8 and 9 depict a vertical mesa structure detector according to the present invention. These are preferably fabricated using well-known techniques (Michel Zécri, Patrick Maillart, "Advanced ROICs Design for Cooled IR Detectors"," Infrared Technology and Applications XXXIV, edited by Bjørn F. Andresen, Gabor F. Fulop, Paul R. Norton, Proc. of SPIE Vol. 6940, 69402X, (2008), incorporated herein by reference, and C. H. Grein, P. Boieriu, M. E. Flatté, "Single- and two-color HgTe/CdTe-superlattice based infrared detectors", Quantum Sensing and Nanophotonic Devices III, edited by Manijeh Razeghi, Gail Brown, Proc. Of SPIE Vol. 6127, incorporated herein by reference). The vertical mesa structure represents a class of detectors in which no implantation methods are used. All required elements are formed by growing layers and etching. These detectors typically have more layers than planar etched detectors.

The vertical mesa structure is first grown as layers on a substrate. In FIG. 8, these include layers 801, which is a band 1 n-type (or p-) material, 802, which is a p-type (or n) material, 803, which is a wide bandgap barrier layer for isolation, 804, which is a band 2 n-type (or p-) material, and 805, which is a p-type (or n-) material. These layers are etched to form the small and large pixels, including etching the trenches 806 for small pixels and etching window 807, which is used for large pixel ground connection 308, and which also delineates the large pixel. Small pixels consist of elements 301, 302, and 303. Elements 301 and 302 form the p-n junction to make the small pixel photodiodes. Element 303 is the small pixel signal connection. It consists of special contact material, and it connects to the readout circuit using well-known methods. Ground connection 304 is used for all of the small pixels within the boundary of the single large pixel. The large pixel consists of elements 305, 306, 307 and 308. Elements 305 and 306 form the p-n junction to make the large pixel photodiode. Element 307 is connection material. It connects to the readout circuit using well-known methods. In this embodiment of the invention, there are 7 rows and 7 columns of small pixels within each large pixel boundary. One small pixel is lost to make room for connection 307.

FIG. 9 shows the same vertical mesa structure of the present invention from a top plan view. Not all elements are visible or fully visible in this view for clarity. Small pixel elements 302 and 303 are shown; element 301 is hidden by 302. Ground contacts 304 are shown as corner contacts; this is one of many possible shapes and positions for these contacts. For the large pixel, elements 307 and 308 are shown. The ground contacts 308 can be realized in other shapes and positioned in other areas, if required or desired. Element 901 is a partial view of large pixel element 305, which is part of layer 802. Layers 801 and 802 can be seen on the edge of the large pixel in this top down view. Layer 804 can be seen in the trenches between small pixels.

For the vertical mesa structure (depicted in FIGS. 8 and 9), the large pixel functions as a single square pixel with no windows for small pixels, as shown in FIG. 5 for the planar detector.

The so-called "back-to-back" triple heterojunction structures shown in FIGS. 10 and 11 require a special approach to implement the present invention's architecture. These two-color focal plane arrays (FPAs) are made using well-known methods (E. P. G. Smith et al, "Status of Two-Color and Large Format HgCdTe FPA Technology at Raytheon Vision Systems", Quantum Sensing and Nanophotonic Devices III, edited by Manijeh Razeghi, Gail Brown, Proc. Of SPIE Vol. 6127, incorporated herein by reference, and P. R. Bratt et al, "Historical Perspective on HgCdTe Material and Device Development at Raytheon Vision Systems," Infrared Technology and Applications XXXIV, edited by Bjørn F. Andresen et al, Proc. Of SPIE Vol. 6542, 6542B, (2007), incorporated herein by reference).

FIG. 10 depicts the back-to-back device structure. Three layers are preferably grown on a substrate: 1001 is n-type (or p-) material; 1002 is p-type (or n-) material; 1003 is n-type (or p-). Each pixel is delineated with an etched trench 1004. Ground contact 1009 is used for both band 1 and band 2 as is signal contact 1005. In this structure, the bias is preferably switched rapidly so that at one moment in time band 2 n-type 1006 and p-type 1007 form a reversed bias photodiode while band 1 n-type 1008 and p-type 1007 form a forward biased diode. Immediately, the bias is reversed so that band 1 n-type 1008 and p-type 1007 form a reversed bias photodiode while band 2 n-type 1006 and p-type 1007 form a forward biased diode. Band 1 light 103 is absorbed only when 1008 and 1007 form a reversed biased p-n junction. Band 2 light 104 is absorbed only when 1006 and 1007 form a reversed biased p-n junction. Whenever the bias is switched, signal switch 1010 switches the photo-generated signal so that it connects to the unit cell readout 1011 for band 1 or cell readout 1012 for band 2, and thus the two bands generate independent signals.

FIG. 11 depicts how to create the present invention in the back-to-back triple heterojunction architecture. Either band 1 (1011) or band 2 (1012) signals are aggregated by means of common connection 1101 on one of the switch 1010 positions. In the figure, connections 1012 for band 2 are aggregated in this manner. From a device standpoint, this is similar to the multiple contact arrangement of FIG. 6. However, signals are not as well isolated, and so, this is an alternative implementation.

In preferred implementations, the detector of the present invention specifically provides for separate ground paths for small and large pixels. The ground contacts 304 and 308 (shown in FIGS. 3, 4, and 6 through 9) are physically separated to minimize coupling. This design helps avoid crosstalk between the small and large pixels and helps ensure that high-speed clock signals do not cause excess noise in the small pixel signals. Also, in the preferred implementation, the small pixel layer is separated from the large pixel layer by a wide bandgap isolation layer, which is shown variously in the different preferred detector structures as 402 (FIGS. 4 and 6), 702 (FIG. 7) and 803 (FIG. 8).

Figure 12:
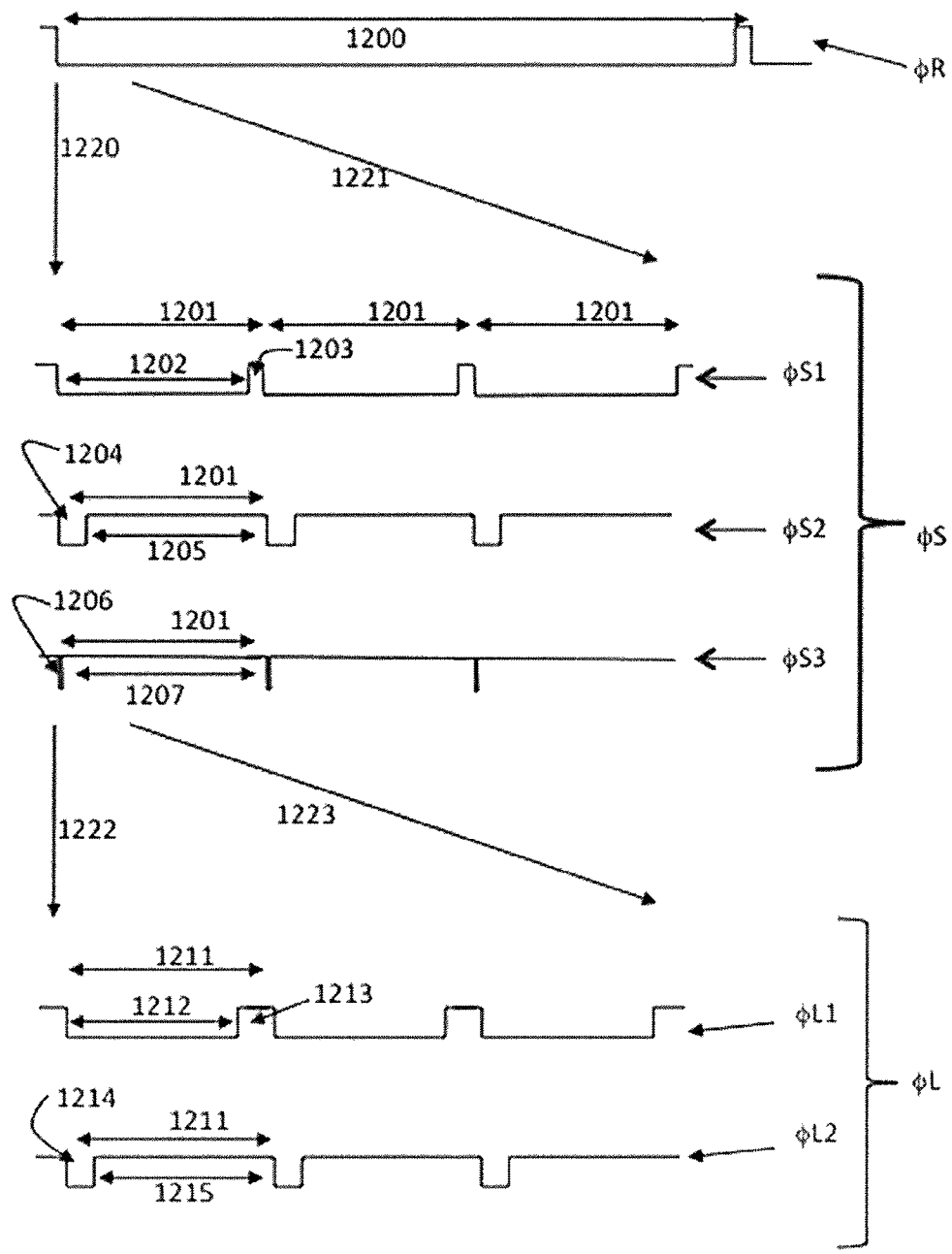

FIG. 12 illustrates the clock signals that are used preferentially in the present invention's readout integrated circuit (ROIC). There are three types of clock signals: the master frame reset clock, labeled as φR; the small pixel clock, labeled as φS and consisting of φS1, φS2, and φS3; and the large pixel clock, labeled as φL and consisting of φL1 and φL2. The master reset clock signals operate across the entire array to control both large and small pixel arrays of the present invention. Pixel clock signals φS1, φS2, φS3, φL1 and φL2 are used simultaneously across the array, with different pixels or groups of pixels being controlled by the different clock signals from this group.

In alternative implementations, a reset pulse signal may be used rather than the reset clock signal φR, the difference being that the reset pulse signal is sent asynchronously rather than at regular intervals. In this case, the reset signal is generated by external logic. All other aspects of the operation of the clock signals remain unchanged if an aperiodic reset pulse is used instead of a reset clock signal.

FIG. 12 shows these clock signals, and their timing relationships. In FIG. 12, one master reset clock cycle is shown, indicated by time 1200. Time 1200 is much longer than the small pixel frame time, indicated by time 1201. Three small pixel frames are shown at a magnified scale, as indicated by time marker 1220, which is the start of the master frame time and the start of the first small pixel frame, and by time marker 1221, which indicates a short portion of the entire time period 1200. As indicated by 1221, the entire master reset time period 1200 is equal to a large number of small pixel frame times 1201, such as 50 or 100. For each master reset, the small pixel clock cycles through this set number of frames. In the case of an aperiodic reset signal, the small pixel clock will cycle through a variable number of frames. Time markers 1222 and 1223 show a large number of the large pixel frame times 1211 are within a single small pixel frame time 1201. Just as for the time 1201 to time 1200 relationship, time 1201 is much longer than time 1211. Typically, each small pixel frame time 1201 equals 10 to 20 large pixel frame times 1211, and for each small pixel frame, the large pixel clock will cycle through this set number of large pixel frames. As time markers 1220 and 1222 indicate, the clock signals are synchronized such that when the master frame reset time period begins (marker 1220), so do a small pixel frame time 1201 and a large pixel frame time 1211. Similarly, whenever a small pixel frame time 1201 begins within a reset time 1200, so does a large pixel frame time 1211. For example, if there are 20 large pixel frames 1211 per small pixel frame 1201, and 50 small pixel frames 1201 per master reset frame 1200, there would be 1000 large pixel frames per master reset.

In FIG. 12, each frame time consists of an integration (accumulation or addition) period and a reset time. Pixel amplifiers will integrate (accumulate or add) photo-generated current during the integration time of their φS and φL signals. During the reset periods, pixels integrate no signal, and the prior signal values are reset to zero. For small pixels, frame time 1201 typically consists of integration time 1202 and reset time 1203, as shown in the φS1 trace. In certain situations, shorter integration times 1204 or 1206 are used, and since the frame rate does not change, the pixels are held in reset for a longer time, 1205 or 1207. The clock signals for these shorter integration times are shown by the φS2 and φS3 traces. For large pixels, frame time 1211 typically consists of integration time 1212 and reset 1213, except in certain situations where shorter integration time 1214 is used along with correspondingly longer reset time 1215. The shorter integration time is shown in trace φL2; the typical operating condition is shown in φL1.

Figure 13:
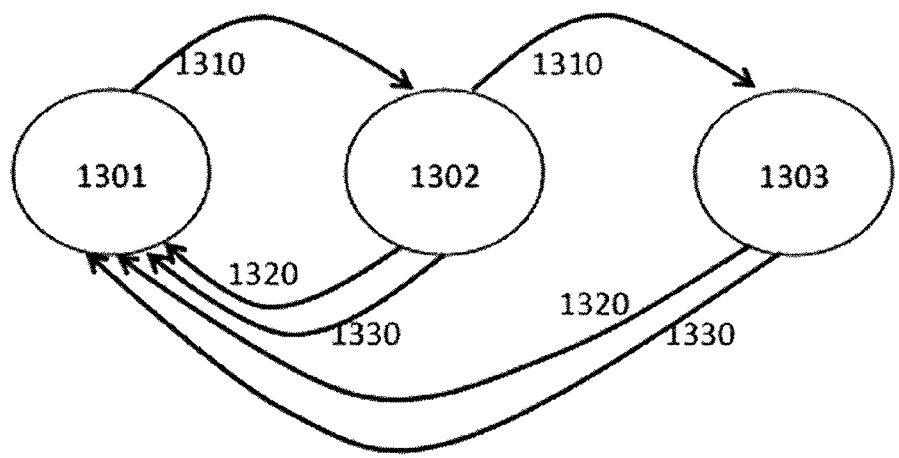
Figure 14:
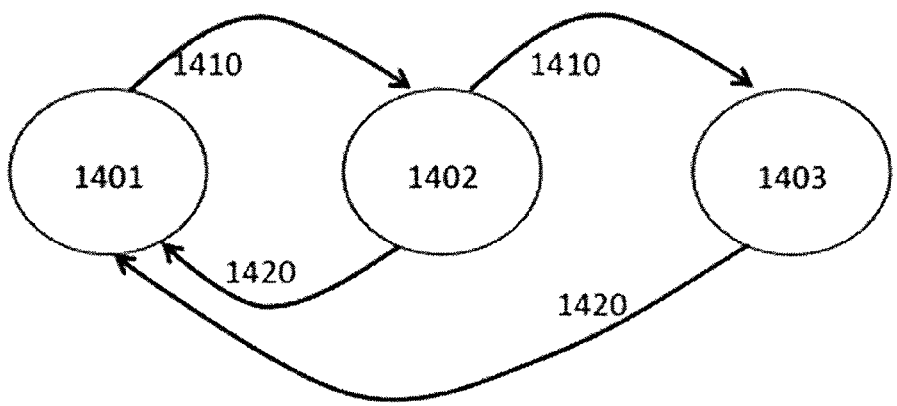
Figure 15:
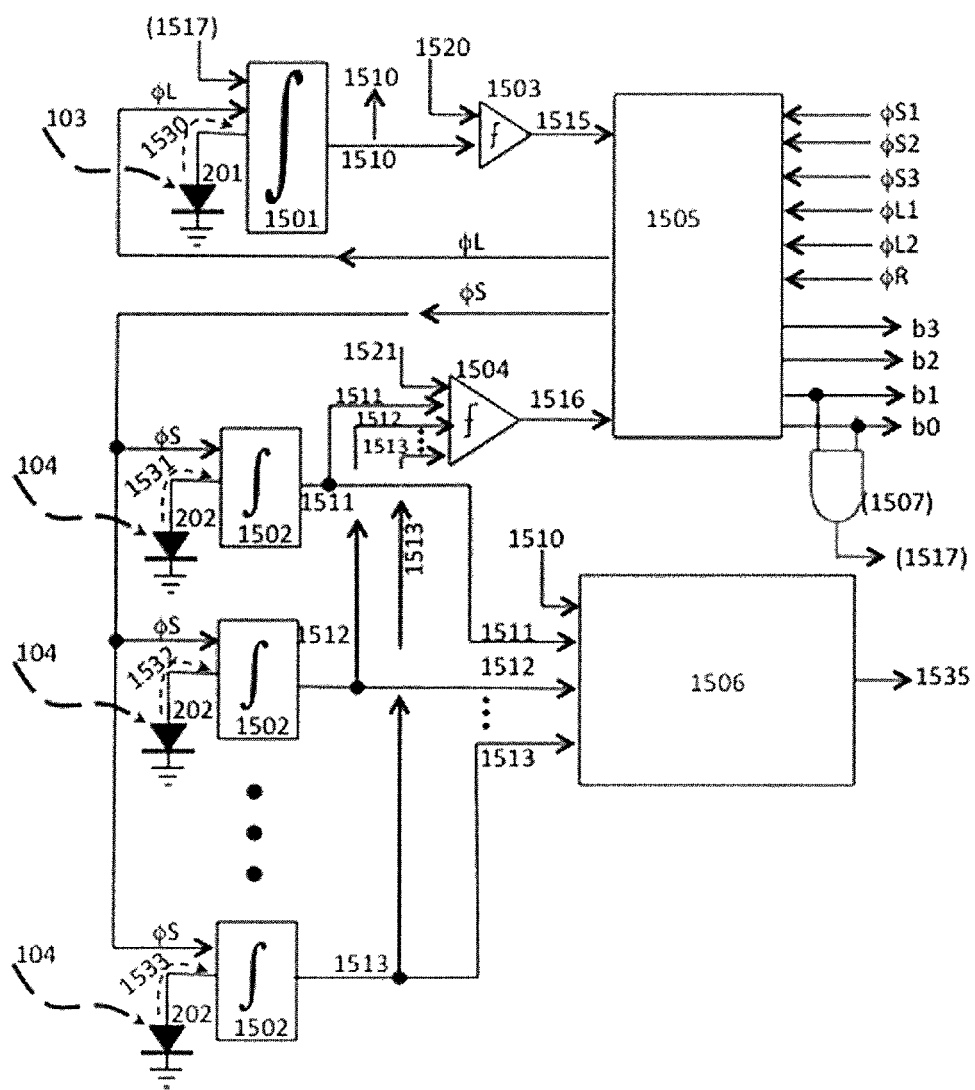

An extended dynamic range of operation for both arrays is realized by using the variable integration times indicated in FIG. 12 by traces φS2, φS3, and φL2. FIGS. 13, 14 and 15 describe how the variable integration timing is controlled. The timing control logic is located on the sensor chip assembly (SCA), i.e. the combined detector and readout integrated circuit, for preferred implementations, but it or portions of it can be located off the SCA in alternate implementations.

Small pixel timing is preferably set for groups of small pixels, not individually. At a minimum, each group of small pixels is defined as the set within a single large pixel boundary. Alternatively, a group of small pixels may be defined as the set within the boundary of several contiguous large pixels. Within a group, all small pixels will use the same pixel clock signal, but for different groups, different pixel clock signals may be used. In this discussion, we use the example of a group of small pixels defined as the set within the boundary of a single large pixel. Therefore, common logic controls timing for the single large pixel and multiple small pixels. For purposes of discussion, FIG. 15 shows connections to three small pixels. In actual implementation, there will be N small pixels, where N is the number of small pixels connected to the control circuit for a single large/small pixel group.

FIG. 15 depicts the ROIC and control circuits for the preferred implementation of the present invention's large/small pixel group. The concept for the circuits and control logic described in FIG. 15 is that the output of pixel amplifiers is sensed with a voltage comparator (a device that compares two voltages and switches its output to indicate which is larger) to determine if it has saturated. If a large pixel amplifier has saturated, the gain is lowered for the next frame by reducing integration time for that large pixel. The concept is similar for small pixels, the only difference is that gain is lowered when a group of small pixels saturates rather than a single small pixel. The size of the group can be controlled flexibly in preferred implementations. For small pixels, this concept can be extended so that integration time is lowered in two steps rather than a single step, allowing for a greater total range of gain control. In large pixels, it is not practically possible to reduce gain in two steps by reducing integration time twice, because this would result in an impractically short integration time. Thus, for large pixels, a second gain reduction, if desired, is achieved by adding capacitance to reduce the transimpedance amplification ratio. Once a pixel has been set to a lower gain value, it will be reset to normal values after a set time interval. This ensures that pixel gain will be set appropriately once the scene or event returns to normal brightness levels. Logical bit values are encoded into the output to indicate the gain state of the large and small pixels.

In FIG. 15, when light 103 of a first color strikes the large pixel diode 201 on the detector, electrons are produced, resulting in photocurrent 1530. Integrating amplifier block 1501 receives photocurrent 1530 and produces output 1510, which is a voltage. Similarly, light 104, a second color, strikes multiple small pixel diodes 202, resulting in photocurrents 1531, 1532 and 1533 which are received by integrating amplifiers 1502. Amplifiers 1502 are identical for each small pixel but are different from amplifier 1501. Amplifiers 1502 produce output voltages 1511, 1512, and 1513, which are typically different from each other and from voltage 1510. Amplifiers 1501 and 1502 can take multiple well-known forms such as Capacitive Transimpedance Amplifier (CTIA), buffered direct input, etc.

For large pixels, voltage 1510 from integrator 1501 is input to comparator 1503. Control voltage 1520 sets the exact operating point for comparator 1503. Whenever voltage 1510 nears saturation, exceeding control voltage 1520, the output of comparator 1503 on connection 1515 will swing to a logic 1, or TRUE value. This input to logic block 1505 indicates whether or not the pixel is in saturation. Logic block 1505 also receives the timing clock signals φL1, φL2, and φR. It maintains internal state information for the large pixel, which is described by FIG. 13.

In FIG. 13, three states are indicated: state 1301, which is standard integration timing; state 1302, which is short integration timing; and state 1303, which is auxiliary gain reduction. State transition events are indicated by 1310, which is comparator 1503 outputs a TRUE value; by 1320, which is small pixel clock reset; and by 1330, which is master frame reset.

In typical operating conditions, large pixel amplifier 1501 (shown in FIG. 15) does not saturate, and comparator 1503 voltage output on 1515 remains at logical FALSE. In this case, the large pixel remains in state 1301 (shown in FIG. 13) and the clock output, φL, is φL1 as shown in FIG. 12, which is the standard timing. If the pixel approaches saturation, comparator 1503 will output TRUE on 1515. The comparator is an analog element, but its input is evaluated at the end of φL integrate, 1212 (shown in FIG. 12). Comparator 1503 TRUE output is state transition 1310, so logic 1505 enters state 1302. This causes the following events:

The clock output is switched to φL2, which is valid on the next φL frame; and
Logic signal bit b0 swings to a TRUE value and logic bit b1 remains at a FALSE value; these values will be encoded into the output stream to indicate the gain setting for the large pixel.

Logic 1505 will remain in state 1302 until one of the three state transition events 1310, 1320 or 1330 occurs. If either 1320, small pixel reset, or 1330, master frame reset, occurs, logic 1505 transitions back to state 1301, which is standard integration timing. In this case, clock output is switched to φL1, standard integration timing, which is valid on the next φL frame, and bit b0 swings to a FALSE value. If event 1310 (comparator 1503 TRUE) occurs from state 1302, logic 1505 transitions to state 1303, which is auxiliary gain that may be implemented in some embodiments. In this case and if the auxiliary gain is implemented, bit b1 swings to a logical TRUE value, clock output is unchanged φL2), and the output of optional AND gate 1507 becomes TRUE, which is the optional gain control signal 1517. The gain signal is used optionally in integration block 1501 for additional gain control if this is available.

For small pixel operation, as shown in FIG. 15, logic block 1505 controls clock input φS input to all the small pixel integrators 1502. Logic block 1505 receives input from comparator 1504 on connector 1516. The operation of comparator 1504 is controlled by input 1521, which is a threshold control voltage. One 1521 voltage value is used for the entire array of the present invention. Comparator 1504 operates such that voltage 1516 will remain at logical FALSE unless a preset number of the small pixel integrators 1502 within the group controlled by 1505 are at or near saturation.

Figure 16:
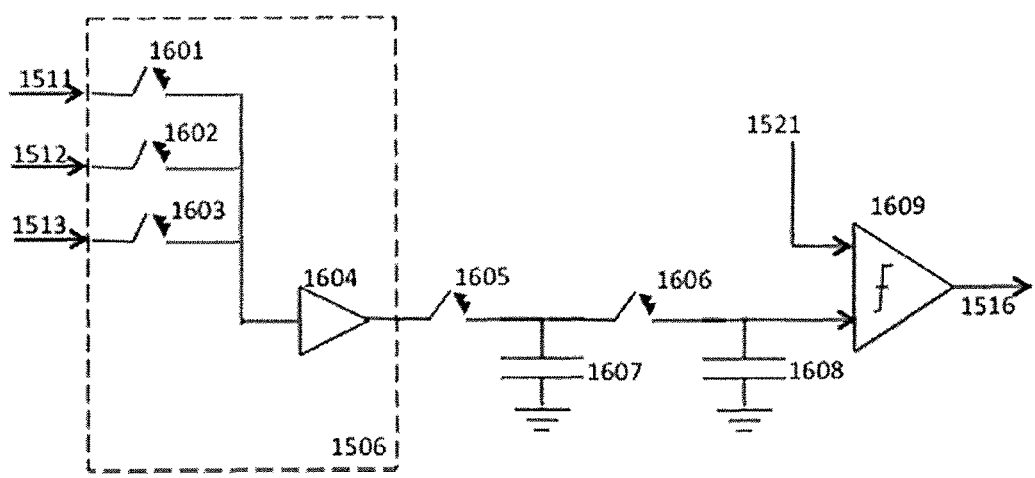

In the preferred embodiment, comparator 1504 is implemented as a capacitive averaging circuit combined with a standard latching comparator such that when the group average of small pixel integrators' 1502 output (voltages 1511, 1512, 1513) exceeds the threshold control voltage 1521, the output of comparator 1504 swings to logical TRUE. FIG. 16 describes the capacitive averaging circuit.

Alternate embodiments are also possible, for example, multiple standard comparators with M out of N voting such that when a set number of individual comparators output logical TRUE, the combined comparator 1504 will output logical TRUE.

FIG. 14 depicts the logic states and operation for logic 1505 control of small pixel timing. Three states are indicated: 1401, standard timing; 1402, short integration timing; and 1403, very short integration timing. State transition events are 1410, which is comparator 1504 value is logical TRUE, and event 1420, which is master frame reset.

In typical operating conditions, the pixels do not saturate, and voltage 1516, the output of comparator 1504 remains at logical 0, or FALSE. In this case, the clock output φS is typical with integration time 1202 and reset time 1203 as shown in FIG. 12, φS1. If the preset number of pixels approach saturation, comparator 1504 will output a TRUE voltage level on connector 1516 as input to logic 1505. This is transition event 1410, which causes logic 1505 to transition to state 1402, and the following events occur:

Small pixel clock output φS is switched to φS2, as depicted in FIG. 12, effective in the next φS frame; and
Bit b2 value swings to TRUE; bit b3 remains at a FALSE value
Logic 1505 will remain in state 1402 until either transition event 1410. (comparator 1516 TRUE) or transition event 1420 (master frame reset). In the case of event 1420, logic 1505 returns to state 1401, bit b2 swings to a logical FALSE value, and φS1 will be output as the small pixel clock signal in the next φS frame. In the case event 1410 from state 1402, logic 1505 transitions to state 1403, both b1 and b0 swing to logical TRUE values, and clock signal φS2 is output on the next φS frame.

The circuit elements 1503, 1504, and 1505, provide 150 dB dynamic range for small pixels (seven and one-half decades) when operated as explained above and with 14 bit ADC and typical operating rates for clocks. Other implementations of the present invention could eliminate the very short integration clock for small pixels, φS3, which would still provide dynamic range of 115 to 125 dB in typical implementations with 14-bit ADC.

For large pixels, the circuits and methods described above provide 130 dB dynamic range (six and one-half decades) when implemented with typical values. Although less than for the small pixels, large pixels are typically operated with a lower gain (10×, or 20 dB, lower), and so the 130/150 dB combination works in the sense that both pixels will saturate at approximately the same optical flux levels (light brightness levels). In case additional dynamic range is required, the large pixel amplifier 1501 can implement an optional dual gain capability. This is controlled by logical signal 1517 from AND gate 1507, also an optional element. When both bits b2 and b3 are TRUE, AND gate 1507 output is TRUE, and this is used to enable the optional lower gain range for amplifier 1501.

Output signal chain 1506 receives the large pixel voltage 1510 and all small pixel voltages (1511, 1512, and 1513). It contains well-known focal plane array elements including switches to select individual pixel output voltages and connect them for external output onto connection 1535. Signal chain 1506 will also typically contain a buffer amplifier, which ensures that the pixel output voltages do not degrade due to external capacitance or resistance in the circuits to which the focal plane array is connected. The signal on connection 1535 is typically an analog voltage, but it may be a digital value in the case of a digital focal plane array. In this case, signal chain 1506 will also contain digitization circuits, such as the well-known sigma-delta circuit.

In alternate embodiments used with digital focal plane arrays, elements 1503, 1504, 1505, and 1507 might not be used. In this case, signal chain 1506 will contain digitization circuits as described above, which are used in combination with other circuit elements for high dynamic range (HDR) operation (S. Kavusi, K. Ghosh and A. El Gamal, "Architectures for High Dynamic Range, High Speed Image Sensor Readout Circuits", incorporated herein by reference).

Also, in alternate embodiments, some clock signals may be generated on the ROIC chip, within logic block 1505. For example, $\phi S2$, and $\phi S3$ could be generated from $\phi S1$ by using a high-speed pixel readout clock, a common element available in all readouts, and on-chip logic.

In the preferred implementation described above, the present invention uses six clock signals and four logical bits to indicate the gain state, as indicated in FIGS. 12 and 15. In alternate implementations, fewer clock signals and fewer gain state bits may be desirable. Practical cases of interest include:
  Case 1: Dual fixed clock signals, one fast for large pixels and one slow for small pixels; and
  Case 2: Dual clock signals with one small pixel clock variation so that only $\phi S1$, $\phi S2$, and $\phi L1$ as shown in FIG. 12 are used.

While not offering the full range of operation of the preferred implementation, each of these practical implementations still offers advantages over current focal plane arrays.

For case 1, the dual array can be operated so as to offset the responsivity range of the large and small pixels, resulting in a large dynamic range through their combined operation. As a specific example, 80 micron large pixels with an electronic gain of 20 nV/electron, an integration time of 10 microseconds, and a full-well capacity of 140 million electrons would result in a sensitivity range of approximately 2.2 times $10^{13}$ to 2.4 times $10^{17}$ photons/second for a pixel-filling optical flux. 20 micron small pixels with an electronic gain of 320 nV/electron, an integration time of 5 milliseconds, and a full-well capacity of 8.75 million electrons would result in a sensitivity range of approximately 4.4 times $10^{10}$ to 4.8 times $10^{14}$ photons/second for full pixel optical flux. The degree of offset in responsivity can be adjusted by adjusting the integration times. Times that are more nearly equal result in less responsivity difference, whereas larger differences in integration times result in larger responsivity differences. This simplified implementation offers the advantage of flexibly extending dynamic range, but it cannot support two-color radiometry across the full dynamic range, as the preferred embodiment can.

For case 2, the $\phi S1$ and $\phi L1$ timing relationships can be set as per the example given for case 1. Setting $\phi S2$ to a shorter integration time, such as 25 microseconds, enables a significantly larger gain range for the small pixels, from approximately 4.4 times $10^{10}$ to 1.2 times $10^{17}$ photons/second for full pixel optical flux. This enables two-color radiometry for hot events typically associated with weapons fire combined with sensitive detection, fine detail imaging, and fast sensing. Thus, this practical implementation realizes most of the desired capabilities for military-use and security-use sensor systems.

FIG. 16 depicts the capacitor averaging comparator that is the preferred implementation for small pixel comparator 1504 (shown in FIG. 15). For purposes of discussion, FIG. 16 shows connection to three small pixel signals: voltages 1511, 1512 and 1513, as depicted in FIG. 15. In actual implementation, there will be N small pixels connected to the control circuit for a single large/small pixel group. Elements 1601, 1602, 1603 and 1604 could be implemented as part of signal output chain 1506, or separately. In operation, switches 1601, 1602 and 1603 operate sequentially. Switch 1601 closes first. Switch 1605 closes immediately afterwards and buffer amplifier 1604 drives capacitor 1607 to voltage 1511, which is the output of the first small pixel amplifier. After this, switch 1605 opens, then switch 1606 closes. This allows charge transfer to occur. After this, switch 1606 opens. Then 1602 and 1605 close, which charges capacitor 1607 to voltage 1512, the output of the second small pixel amplifier and different from voltage 1511. After this, switch 1605 opens, then 1606 closes. This allows a second charge transfer between the two capacitors. This operation continues until the last small pixel value (1513) is read. At any time during the sensing of voltages 1511, 1512, and 1513 if the voltage on capacitor 1608 rises above the comparator control voltage, the output of comparator 1609 will latch to a high value. It will remain high until a small pixel frame reset.

In this circuit, the capacitive averaging between 1607 and 1608 operates similarly to sub-frame averaging circuits, which are described in U.S. Pat. No. 4,686,373 to Tew et al. and U.S. Pat. No. 5,629,522 to Martin et al., incorporated herein by reference, and in many other documents. However, unlike the previously described uses of the sub-frame averaging circuit, which averages signals in time, here the circuit is used to average multiple pixel values during the same frame time. The relative size of capacitors 1607 and 1608 and the control voltage 1521 on latching comparator 1609 determine the operational characteristics of this circuit. The ratio of capacitor 1608 to capacitor 1607 will be one-to-one or larger, i.e. two-to-one, three-to-one, etc. Smaller ratios result in a faster voltage swing on capacitor 1608 when the voltages for pixels in saturation are sensed. This requires fewer small pixels to be in saturation in order for comparator output 1516 to swing to a high or logical TRUE value than for larger capacitor ratios. Larger ratios result in a slower swing, which will require a greater number of small pixels to be in saturation in order for output 1516 to swing to a high or TRUE value.

This capacitive averaging comparator circuit works so that if a few pixels in succession are near saturation, the comparator will latch high; however, if the near saturated pixels are not in succession, then it takes more pixels or a fully saturated value to cause the comparator to latch high. Thus, it takes a signal in one place (pixels in succession) to cause a state change, or a brighter signal if the bright area is diffuse: real, non-clutter signals will tend to be in one place, not scattered.

As described above, preferably the capacitive averaging comparator circuit of FIG. 16 provides for weighted averaging based on the ratios of capacitors 1607 and 1608. By making the second capacitor 1608 larger, a greater number of pixels near saturation are required to result in a high value on the second capacitor. Thus, a capacitor ratio can be designed based on how many pixels are in a group and the number desired to be near saturation before the comparator is latched. Typically, it would be desired that no fewer than 2 or 3 pixels near saturation would cause the comparator to be latched: this would be achieved with a capacitive ratio of 1:1 or 1:1.5. However, the capacitive ratio can be increased to 1:2 or more, if a larger number is desired for design reasons.

Figure 17:
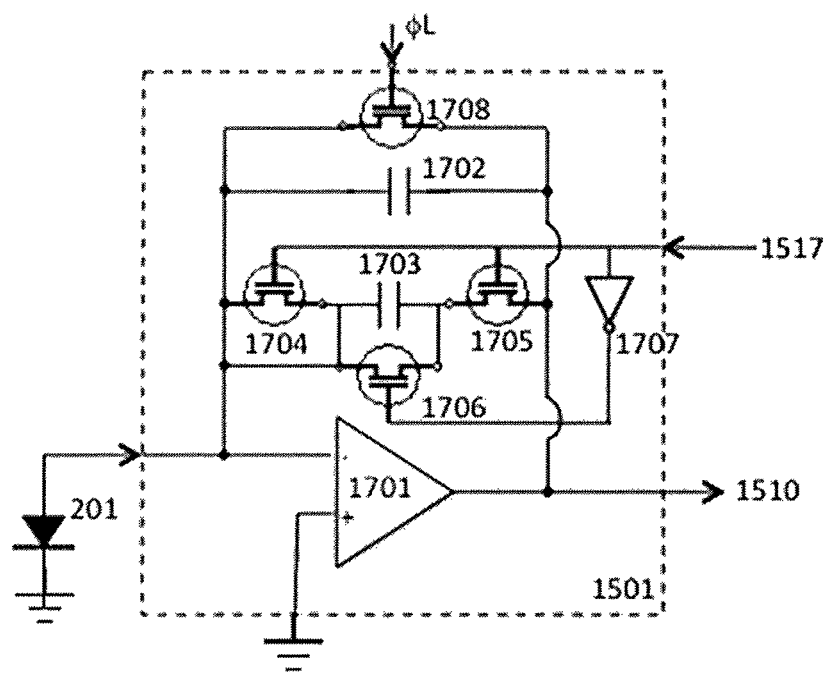

FIG. 17 shows one implementation of the large pixel amplifier 1501 (shown in FIG. 15) with optional electronic gain control. A CTIA (Capacitive Transimpedance Amplifier) is used. Photocurrent from large pixel 201 is input to op amp 1701. In addition to capacitor 1702, the standard integration capacitor for the CTIA, a second and larger capacitor, 1703, is also included in the circuit. Switches 1704, 1705, and 1706 control this second capacitor based on the optional gain signal 1517. If 1517 is high (logical TRUE), switches 1704 and 1705 are on while 1706 is off due to inverter 1707. This adds capacitor 1703 into the circuit, adding its capacitance to that of 1702, and reducing the amplifier's electronic gain. If the gain signal 1517 is low (logical FALSE), switches 1704 and 1705 are off, and switch 1706 is on, keeping capacitor 1703 at a near zero voltage. Large pixel clock $\phi L$ controls the reset switch 1708. It turns on for reset ensuring that voltage on 1703—and 1704 if used—will be driven to near zero.

In any preferred implementation, the small pixel amplifier 1502 (shown in FIG. 15) is a simple amplifier with no elements to enable additional gain control. The small pixel amplifier can take multiple forms such as buffered direct input, CTIA, and so forth.

The presently preferred embodiment of the invention utilizes special methods to perform two-color radiometry, which enable higher accuracy results. In conventional two-color cameras, detection is enhanced by determining simple pixel brightness relationships (R. Waterman, "Two Color IRFPAs for Navy Missile Warning", Night Operations Symposium, 13 Mar. 2002, NDIA, Arlington, Va. Accession number ADM002270, incorporated herein by reference). For example, color-one is brighter than color-two, or they are approximately equal. In the present invention, new methods enhance accuracy and account for differences between the large and small pixels.

In a typical array, the first video processing step is non-uniformity correction (NUC). This well-known technique normalizes data to account for the inherent differences in response between pixels to the same optical input; some pixels exhibit higher gain, some lower, and there are difference in offset, the signal present with no illumination. After this, detection methods utilize temporal and spatial methods that identify likely events. These detection methods require that the system continuously determine statistical characteristics of the typical scene, for example, the average brightness and variation in brightness. This information is used to determine when something unusual has occurred, such as a bright flash of light that exceeds the average by a statistically significant amount. Then, the system uses two-color methods to determine if the unusual event is likely to be a threat. For example, a flash of light observed from an airborne platform, which is brighter than the surrounding background by a statistically significant amount, could be a missile launch. If the two-color test indicates a temperature near 5800 degrees Kelvin, the bright flash is a solar glint and can be dismissed, whereas if the two-color test is consistent with a temperature in the 1000 to 2000 degree Kelvin range, it may be a missile launch.

These steps can be summed up as follows:

Non-Uniformity Correction (NUC).

This corrects for variation in pixel response so that when the system views an optically flat background (same color, same brightness), it produces an optically flat image.

Determine Background.

Average background brightness and variation is determined in both colors using well-known spatial-temporal techniques, which include pixel averages and variation over time, and determining averages and variations across small areas (groups of pixels).

Detect Event.

Events are detected using well-known statistical methods, for example, whenever a short-term average exceeds a long-term average by a pre-designated number of standard deviations. Pixels are typically processed in small contiguous groups, such as 3×3 pixel groups.

Two-Color Tests.

These determine whether events detected in the Detect Event step are real threats based on an approximate temperature determination.

For the dual array, the first two steps—NUC and Determine Background—are performed as for standard arrays. After these first two steps, the process differs. First, two types of spatial-temporal detection processing is performed:

Detect Fast Events.

Large pixel data is processed with algorithms that detect events that occur within a specified time range, such as a total event time of 2 milliseconds. Typically, individual pixel data is used for the fast event processing rather than pixel groups.

Detect Standard Events.

Small pixel data is processed using well-known methods typically used in standard arrays. Typically, small groups of pixels are used. For the dual array, these groups are of a different size than the small pixel sub-array associated with a large pixel.

Once either a fast or standard event is detected, two-color methods are used to determine if it is a real threat. However, the pixel data must be normalization for proper comparison due to the different electronic gains, integration times, and spatial IFOV's (the pixel Instantaneous Field of View). Explicit adjustments are made due to the presence of back-ground light, i.e. that part of the scene excluding the event of interest. The normalization processing consists of corrections for spatial and temporal factors, then adjusting for pixel responsivity differences.

Correct Large Pixel Response for Spatial Extent.

Figure 18:
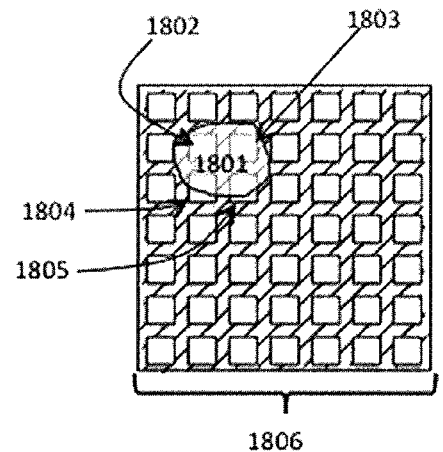

FIG. 18 shows the example of event 1801 on large pixel 1806. The spatial extent of event 1801 is much smaller than pixel 1806, so the total response from 1806 will consist of event 1801 and background light. Therefore, the background average value, weighted to account for the spatial extent of the event, is subtracted from the overall large pixel response to determine the response to event 1801 alone. The small pixel response is used to determine the spatial extent of 1801 and what the weighting value should be. In this case, event 1801 covers about 8% of the large pixel, so a weighting factor of 0.92 would be used. In this example, event 1801 is very small, and this indicates that the spatial extent of event 1801 is defined by the optical diffraction limit of the system. Therefore, the weighting factor would be adjusted in consideration of the wavelength of the two color bands. For example, if the small pixels respond with a center wavelength of 8 microns, and the large pixels response with a center wavelength of 4 microns, a weighting factor of 0.96 would be used. For events with larger spatial extents or for closely spaced spectral bands, this adjustment to the weighting factor for wavelength difference is not necessary. For events that fill the entire large pixel, no correction for spatial extent is necessary.

Correct Small Pixel Data for Temporal Extent.

Figure 19:
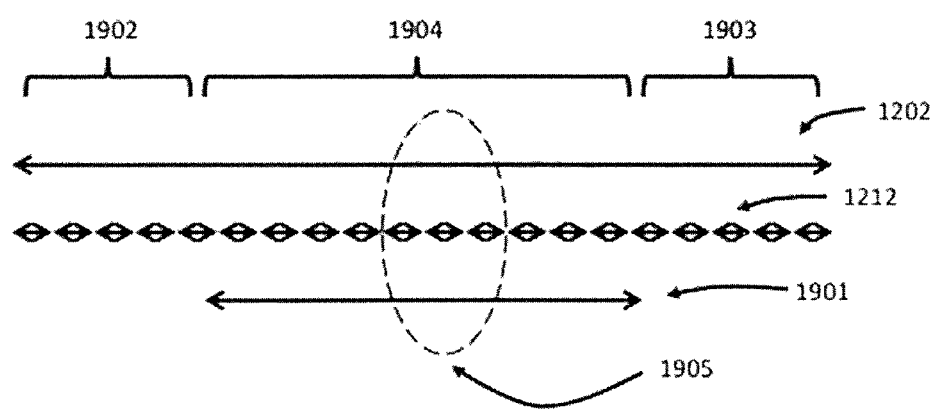

FIG. 19 shows the example of an event with duration 1901. Also shown are the small pixel integration time 1202 (see FIG. 12) and the large pixel integration time 1212 (see FIG. 12). This event has a duration less than time 1202, and so the total small pixel response will consist of background, which is integrated during the time periods indicated by 1902 and 1903, as well as the signal of interest, which is integrated during the time period indicated by 1904. Based on these time durations, the small pixel background average, weighted based on time periods 1904 and 1902 plus 1903, is subtracted from the total pixel response to determine the response due to the event of interest. In this example, the event duration is 10 time periods 1212, and the background illumination period is 20 time periods 1212. Therefore, the weighting factor would be 0.66, and this adjusted background would be subtracted from the overall small pixel response.

Correct for Pixel Gain.

The above two steps adjust for two out of the three necessary factors: the different integration times used by large and small pixels and their different spatial extent, which is equivalent to adjusting for their different sizes. The last factor is electronic gain, which is a fixed factor set by design unless auxiliary gain is used in the large pixel. The electronic gain is the transimpedance gain of the pixel amplifier, and the correction factor is simply the ratio between large pixel amplifiers and small pixel amplifiers.

Once the two-color data has been normalized with these three steps, color ratios can be determined. In FIG. 18, pixels 1802, 1803, 1804, and 1805 would be added together, and this total response would be compared to large pixel 1806. Alternatively, each small pixel could be compared individually; this would require a secondary normalization to account for pixel size. In FIG. 19, time periods 1212 within event duration 1901 would be added together and compared to the adjusted small pixel response. Alternatively, large pixel data from time periods 1212 within time period 1905, which might represent peak intensity of the signal of interest, could be compared with the adjusted small pixel response. This would require a secondary normalization to account for the shorter time period 1095. Any of these two-color ratios could be used in existing or new algorithms for threat determination.

Because the dual array two-color processing explicitly accounts for spatial and temporal extent of the signal of interest and removes invalid background light, it provides more accurate radiometric measures than standard arrays. It also provides enhanced flexibility by enabling a variety of peak signal or average signal measurements.

While the present invention is being disclosed in connection with the presently preferred embodiment described herein, it should be understood that there might be other embodiments that fall within this spirit and scope of the invention as defined by the claims. Accordingly, no limitations are to be implied or inferred in this invention except as specifically and explicitly set forth in the claims.

INDUSTRIAL APPLICABILITY

This invention can be used any time it is necessary or desirable to achieve a sensor with the ability to sense very high-speed events, produce a high-resolution image, support a high (large) dynamic range, and avoid false alarms from manmade signals or clutter.

What is claimed is:

1. A focal plane imaging array having a dynamic range, comprising:
   a detector with a large pixel array having a plurality of large pixels, each of said large pixels having a large pixel area and a large pixel signal contact, to create a first signal that travels to said large pixel signal contact, and a small pixel array having a plurality of small pixels, each of said small pixels having a small pixel area and a small pixel signal contact, to create a second signal that travels to said small pixel signal contacts, wherein said plurality of small pixels is larger than said plurality of large pixels, wherein said large pixel array and said small pixel array are aligned and vertically stacked on a monolithic semiconductor substrate;
   a readout integrated circuit operably interconnected to said large pixel signal contacts and said small pixel signal contacts; and
   a clock operably connected to said large pixel signal contacts and said small pixel signal contacts to read said first signals at a first clock rate having a first integration time and a first reset time, and to read said second signals at a second clock rate having a second integration time and a second reset time;
   wherein said first clock rate is faster than said second clock rate;
   whereby reading of said first signals at said first clock rate, and said second signals at said second clock rate, extends said dynamic range.

2. A focal plane imaging array according to claim 1, wherein said large pixel area is at least twice as large as said small pixel area.

3. A focal plane imaging array according claim 1, wherein said first clock rate is at least 1500 frames per second.

4. A focal plane imaging array according claim 1, wherein said second clock rate is no more than 500 frames per second.

5. A focal plane imaging array according to claim 1, further comprising a wide band gap barrier between said large pixel array and said small pixel array to prevent crosstalk between said large pixels and said small pixels.

6. A focal plane imaging array according claim 1, wherein said large pixels are responsive to a first brightness range, and said small pixels are responsive to a second brightness range, and wherein said first brightness range is different from said second brightness range.

7. A focal plane imaging array according to any one of claim 1, 2, 3, 4, 5, or 6, wherein said readout integrated circuit further comprises:
   a large pixel amplifier having an electrical gain for receiving said first signal and creating a large pixel output voltage;
   a large pixel comparator to receive said large pixel output voltage;
   wherein when said large pixel output voltage indicates that said large pixel is saturated, said large pixel comparator outputs a TRUE value that changes said first clock rate to have a first changed integration time and a first changed reset time, wherein said first changed integration time is shorter than said first integration time and said first changed reset time is greater than said first reset time, and wherein if said large pixel output voltage indicates that said large pixel is unsaturated, said large pixel comparator outputs a FALSE value and said first clock rate maintains said first integration time and said first reset time;

a plurality of small pixel amplifiers for receiving said second signal and creating small pixel output voltages; and a small pixel comparator to receive said small pixel output voltages;

wherein when said small pixel output voltages indicate that a preset number of small pixels are saturated, said small pixel comparator outputs a TRUE value that changes said second clock rate to have a second changed integration time and a second changed reset time, wherein said second changed integration time is less than said second integration time and said second changed reset time is greater than said second reset time, and wherein if said small pixel output voltages indicate that said small pixels are unsaturated, said small pixel comparator outputs a FALSE value and said second clock rate maintains said second integration time and said second reset time;

wherein if said small pixel output voltages indicate that a preset number of said small pixels are saturated while using said second changed integration time and a second changed reset time, said small pixel comparator will output another TRUE value that changes said second clock rate so that it has a second re-changed integration time and a second re-changed reset time, wherein said second re-changed integration time is shorter than said second changed integration time and said second re-changed reset time is longer than said second changed reset time, and wherein if said small pixel output voltages indicate that said small pixels are unsaturated while using said second changed integration time and a second changed reset time, said small pixel comparator will output a FALSE value and said second clock rate will remain at said second changed integration time and said second changed reset time;

whereby the reading of said first signals at said first changed integration time, and said second signals at said second changed integration time and said second re-changed integration time, extends said dynamic range.

8. A focal plane imaging array according to claim 7, further comprising:

a master frame reset clock to send a small pixel reset signal, which causes said second changed integration time and second changed reset time to return to said second integration time and said second reset time, and causes said second re-changed integration time and said second re-changed reset time to return to said second integration time and said second reset time.

9. A focal plane imaging array according to claim 7, wherein said second reset time, said second change reset time, or said second re-changed reset time, causes a large pixel reset signal which changes said first changed integration time and said first changed reset time to said first integration time and first reset time.

10. A focal plane imaging array according to claim 7, wherein said large pixel amplifier further comprises:

a first integration capacitor for storing said first signal and producing said large pixel output voltage; and a second integration capacitor for storing said first signal;

wherein if said large pixel output voltage is saturated, said second integration capacitor is turned on to reduce said electrical gain, and if said large pixel output voltage is unsaturated, said second integration capacitor is turned off.

11. A focal plane imaging array according to claim 1, wherein said large pixels absorb a first wavelength and said small pixels absorb a second wavelength.

12. A focal plane imaging array according to claim 7, wherein said small pixel comparator comprises a capacitor averaging comparator for comparing a plurality of pixel electrical signals, each having a signal voltage, further comprising:

a plurality of signal switches, each signal switch corresponding to one of said pixel electrical signals;

a buffer amplifier connected to said signal switches;

a first capacitor;

a first capacitor switch connected between said buffer amplifier and said first capacitor;

a second capacitor;

a second capacitor switch connected between said first capacitor and said second capacitor; and a latching comparator connected to said second capacitor controlled by a comparator control voltage;

wherein when said signal switches are sequentially closed, each of said pixel electrical signals is sequentially sent to said buffer amplifier, said first capacitor switch is closed, said buffer amplifier drives said first capacitor to store a first stored voltage that is proportional to said signal voltage, said first capacitor switch opens, said second capacitor switch closes and charge is transferred between said first and second capacitors, causing any prior stored voltage on said second capacitor and said first stored voltage on said first capacitor to form a weighted average voltage, and said comparator compares said weighted average voltage to said comparator control voltage;

wherein said weighted average is based on the ratio of capacitance between said first capacitor and said second capacitor, and wherein if any of said weighted average voltages exceeds said comparator control voltage, then said comparator latches to a high value.

13. A process for using a focal plane imaging array having a background brightness and a detector operably connected to a readout circuit having a large pixel array having a plurality of large pixels, each of said large pixels having a large pixel area and a large pixel signal contact, to absorb a first wavelength, and a small pixel array having a plurality of small pixels, each of said small pixels having a small pixel area and a small pixel signal contact, to absorb a second wavelength, wherein said plurality of small pixels is greater than said plurality of large pixels, and wherein said large pixel array and said small pixel array are aligned and vertically stacked on a monolithic semiconductor substrate, comprising:

illuminating said large pixel array and small pixel array with an infrared light source to create a first signal that travels to said large pixel signal contacts, and a second signal that travels to said small pixel signal contacts;

clocking said first signal at a first clock rate having a first integration time and a first reset time, and said second signal at a second clock rate having a second integration time and a second reset time, wherein said first clock rate is faster than said second clock rate; and shortening said first integration time if said first signal saturates said large pixels between said first rest times, and reducing said second integration time if said second signal saturates said small pixels between said second reset times;

whereby said process achieves extended dynamic range and better clutter rejection for said focal plane array.

14. The process of claim 13, further comprising:

determining an average for said background brightness;

processing said first signal to detect fast events having a fast event brightness that occurs within a time range, and said second signal to detect standard events having a standard event brightness, wherein said fast event brightness is comprised of said background brightness and an actual fast event brightness, and said standard event brightness is comprised of said background brightness and an actual standard event brightness;

calculating said actual fast event brightness and said actual standard event brightness;

comparing said actual fast event brightness and said actual standard event brightness to approximate a temperature range for said fast events and said standard events; and determining whether said fast events and said standard events are threatening based on said temperature range.

15. The process of claim 14, wherein said calculating step further comprises:

determining a spatial correction factor for said fast event brightness based on the spatial extent of said standard event brightness, and a temporal correction factor for said standard event brightness based on the duration of said fast event brightness;

correcting said background brightness using said spatial correction factor to achieve a spatially corrected background brightness, and using said temporal correction factor to achieve a temporally corrected background brightness; and subtracting said spatially corrected background brightness from said fast event brightness to achieve said actual fast event brightness, and subtracting said temporally corrected background brightness from said standard event brightness to achieve said actual fast event brightness.

* * * * *